United States Patent
Sato et al.

(10) Patent No.: US 11,456,264 B2
(45) Date of Patent: Sep. 27, 2022

(54) METHOD OF MANUFACTURING SEMICONDUCTOR DEVICE

(71) Applicant: RENESAS ELECTRONICS CORPORATION, Tokyo (JP)

(72) Inventors: Yoshiaki Sato, Tokyo (JP); Mitsunobu Wansawa, Tokyo (JP); Akira Matsumoto, Tokyo (JP); Yoshinori Deguchi, Tokyo (JP); Kentaro Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/148,923

(22) Filed: Jan. 14, 2021

(65) Prior Publication Data
US 2021/0272917 A1 Sep. 2, 2021

(30) Foreign Application Priority Data
Feb. 27, 2020 (JP) ............................. JP2020-031649

(51) Int. Cl.
*H01L 23/00* (2006.01)
*H01L 21/56* (2006.01)
(Continued)

(52) U.S. Cl.
CPC .......... *H01L 24/03* (2013.01); *H01L 21/4853* (2013.01); *H01L 21/563* (2013.01);
(Continued)

(58) Field of Classification Search
CPC ... H01L 24/03; H01L 21/4853; H01L 21/563; H01L 22/14; H01L 24/05; H01L 24/11;
(Continued)

(56) References Cited

U.S. PATENT DOCUMENTS 8,101,433 B2   1/2012   Akiba et al.
9,711,377 B2   7/2017   Akiba et al.
(Continued)

FOREIGN PATENT DOCUMENTS

JP   2009-246218 A   10/2009
JP   2016-092305 A   5/2016
JP   2020-017642 A   1/2020

*Primary Examiner* — Douglas W Owens
(74) *Attorney, Agent, or Firm* — McDermott Will & Emery LLP

(57) ABSTRACT

In a method of manufacturing a semiconductor device according to one embodiment, after a semiconductor wafer including a non-volatile memory, a bonding pad and an insulating film comprised of an organic material is provided, a probe needle is contacted to a surface of the bonding pad located in a second region, and a data is written to the non-volatile memory. Here, the insulating film is formed by performing a first heat treatment to the organic material. Also, after a second heat treatment is performed to the semiconductor wafer, and the non-volatile memory to which the data is written is checked, a barrier layer and a first solder material are formed on the surface of the bonding pad located in a first region by using an electroplating method. Further, a bump electrode is formed in the first region by performing a third heat treatment to the first solder material.

15 Claims, 19 Drawing Sheets

(51) Int. Cl.
  *H01L 21/48* (2006.01)
  *G11C 16/04* (2006.01)
  *H01L 21/66* (2006.01)

(52) U.S. Cl.
  CPC .............. *H01L 22/14* (2013.01); *H01L 24/05* (2013.01); *H01L 24/11* (2013.01); *H01L 24/13* (2013.01); *H01L 24/81* (2013.01); *G11C 16/0408* (2013.01); *H01L 2224/0392* (2013.01); *H01L 2224/03825* (2013.01); *H01L 2224/03826* (2013.01); *H01L 2224/03848* (2013.01); *H01L 2224/0401* (2013.01); *H01L 2224/05124* (2013.01); *H01L 2224/05155* (2013.01); *H01L 2224/05564* (2013.01); *H01L 2224/11462* (2013.01); *H01L 2224/11848* (2013.01); *H01L 2224/13027* (2013.01); *H01L 2224/13111* (2013.01); *H01L 2224/81203* (2013.01); *H01L 2224/81815* (2013.01); *H01L 2924/14511* (2013.01); *H01L 2924/20104* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01)

(58) Field of Classification Search
  CPC .................... H01L 24/13; H01L 24/81; H01L 2224/03825; H01L 2224/03826; H01L 2224/03848; H01L 2224/0392; H01L 2224/0401; H01L 2224/05124; H01L 2224/05155; H01L 2224/05564; H01L 2224/11462; H01L 2224/11848; H01L 2224/13027; H01L 2224/13111; H01L 2224/81203; H01L 2224/81815; H01L 2924/14511; H01L 2924/20104; H01L 2924/20105; H01L 2924/20106; H01L 2924/20107; H01L 2924/20108; H01L 2924/20109; G11C 16/0408
  See application file for complete search history.

(56) References Cited

U.S. PATENT DOCUMENTS

| | | | |
|---|---|---|---|
| 2008/0042275 A1* | 2/2008 | Kuan | H01L 24/13 257/738 |
| 2010/0167432 A1* | 7/2010 | Abiru | H01L 24/03 257/E21.531 |
| 2013/0193438 A1* | 8/2013 | Akiba | H01L 22/32 257/48 |

* cited by examiner

METHOD OF MANUFACTURING SEMICONDUCTOR DEVICE

CROSS-REFERENCE TO RELATED APPLICATIONS

The disclosure of Japanese Patent Application No. 2020-031649 filed on Feb. 27, 2020 including the specification, drawings and abstract is incorporated herein by reference in its entirety.

BACKGROUND

The present invention relates to a semiconductor device and a method of manufacturing the same, and more particularly, the present invention can be suitably applied to a semiconductor chip having a non-volatile memory subjected to a wafer testing process, and a bump electrode electrically connected with the non-volatile memory and also comprised of tin (Sn), and a method of manufacturing the semiconductor chip.

There are disclosed techniques listed below.
[Patent Document 1] Japanese Unexamined Patent Application Publication No. 2009-246218
[Patent Document 2] Japanese Unexamined Patent Application Publication No. 2016-92305
[Patent Document 3] Japanese Unexamined Patent Application Publication No. 2020-17642

There is a semiconductor chip comprising a bonding pad having a region to where a probe needle is to be contacted, and a region on where a bump electrode is to be formed via a conductive film formed by using an electroplating method (for example, see FIG. 34 of Patent Document 1). Also, in order to avoid a data written to a memory circuit from disappearing due to a heat treatment (heating temperature) at the time of forming an insulating film comprised of an organic material, there is also a method of manufacturing a semiconductor device comprising: after forming the insulating film by performing the heat treatment to the organic material, contacting a probe needle to a surface of a bonding pad, and writing a data to the memory circuit (for example, see FIG. 3 of Patent Document 2). Furthermore, there is also a semiconductor chip comprising a semiconductor substrate on which an insulating film, that has an opening portion exposing a region to where a probe needle is to be contacted, and an opening portion exposing a region on where a conductive film is to be formed by using an electroplating method, is formed (for example, see FIG. 13 of Patent Document 3).

SUMMARY

The present inventors have studied a miniaturization (specifically, "thinning") of a semiconductor chip having a non-volatile memory subjected to a wafer testing process, and a bump electrode electrically connected with the non-volatile memory and also comprised of tin (Sn). Also, it is found by the present inventors that in accordance with the miniaturization of the semiconductor chip, there is a possibility that the data written to the non-volatile memory in the wafer testing process is lost.

Other objects and novel features will become apparent from the description of this specification and the accompanying drawings.

The typical ones of the embodiments disclosed in the present application will be briefly described as follows.

A method of manufacturing a semiconductor device according to one embodiment, comprises: (a) providing a semiconductor wafer including a non-volatile memory, a bonding pad and an insulating film comprised of an organic material. Here, a surface of the bonding pad has a first region and a second region. And, the insulating film is formed by performing a first heat treatment to the organic material. Also, the method comprises: (b) after the (a), contacting a probe needle to the surface of the bonding pad located in the second region, and writing a data to the non-volatile memory. Also, the method comprises: (c) after the (b), performing a second heat treatment to the semiconductor wafer, and checking the non-volatile memory to which the data is written. Here, a temperature of the second heat treatment is lower than a temperature of the first heat treatment. And, a time of the second heat treatment per one time is longer than a time of the first heat treatment per one time. Also, the method comprises: (d) after the (c), forming a barrier layer on the surface of the bonding pad located in the first region by using an electroplating method. Also, the method comprises: (e) after the (d), forming a first solder material on the barrier layer by using the electroplating method. Further, the method comprises: (f) after the (e), forming a bump electrode on the surface of the bonding pad located in the first region via the barrier layer by performing a third heat treatment to the first solder material. Here, a temperature of the third heat treatment is lower than the temperature of the first heat treatment. And, a time of the third heat treatment per one time is shorter than the time of the second heat treatment per one time.

Also, a method of manufacturing a semiconductor device according to another embodiment, comprises: (a) providing a semiconductor wafer including a non-volatile memory, a bonding pad and an insulating film comprised of an organic material. Here, a surface of the bonding pad has a first region and a second region. And, the insulating film is formed by performing a first heat treatment to the organic material. And, a temperature of the first heat treatment is 300° C. to 400° C. Furthermore, a time of the first heat treatment per one time is 30 minutes to 2 hours. Also, the method comprises: (b) after the (a), contacting a probe needle to the surface of the bonding pad located in the second region, and writing a data to the non-volatile memory. Also, the method comprises: (c) after the (b), performing a second heat treatment to the semiconductor wafer, and checking the non-volatile memory to which the data is written. Here, a temperature of the second heat treatment is 200° C. to 280° C. And, a time of the second heat treatment per one time is 6 hours to 50 hours. Also, the method comprises: (d) after the (c), forming a conductive film on the surface of the bonding pad located in the first region by using an electroplating method. Also, the method comprises: (e) after the (d), forming a first solder material on the conductive film by using the electroplating method. Also, the method comprises: (f) after the (e), forming a bump electrode on the surface of the bonding pad located in the first region via the conductive film by performing a third heat treatment to the first solder material. Here, a temperature of the third heat treatment is 100° C. to 270° C. And, a time of the third heat treatment per one time is several tens of seconds to 5 minutes. Further, the method comprises: (g) after the (f), obtaining a semiconductor chip having the bump electrode, the conductive film, the bonding pad and the non-volatile memory by cutting the semiconductor wafer.

According to said method of manufacturing semiconductor device in one embodiment, it is possible to improve the reliability of said semiconductor device.

According to said method of manufacturing semiconductor device in another embodiment, it is possible to improve the reliability of said semiconductor device.

DETAILED DESCRIPTION

Figure 1:
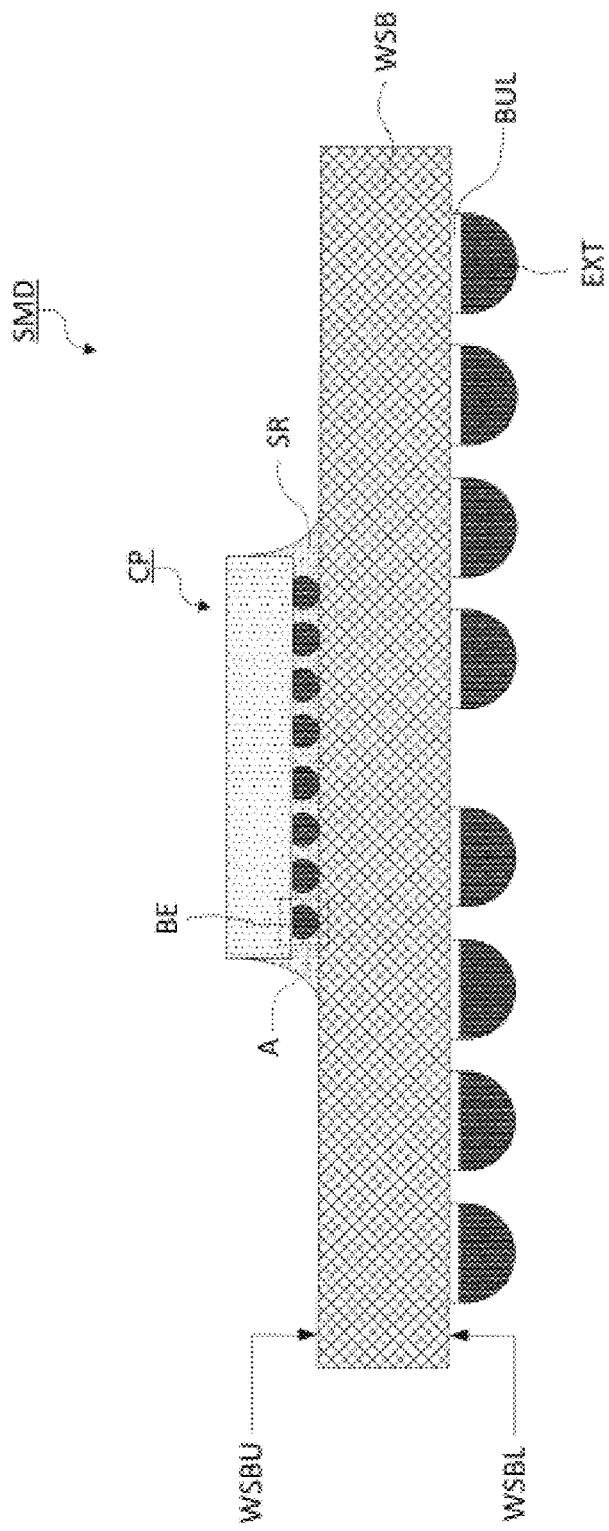
FIG. 1 is a cross-sectional view illustrating a configuration of a semiconductor device according to the present embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The following embodiments will be explained in detail based on the drawings. In all the drawings for explaining the embodiments, members having the same functions are denoted by the same reference numeral and hatches, and repetitive descriptions thereof are omitted. In the following embodiments, descriptions of the same or similar parts will not be repeated in principle except when particularly necessary. In the drawings used in the embodiments, hatching may be omitted even in the case of cross-sectional view in order to make the drawings easier to see. Also, even in the case of a plan view, hatching may be used to make the drawing easier to see.

Embodiment

<Semiconductor Device SMD According to Present Embodiment>

Figure 2:
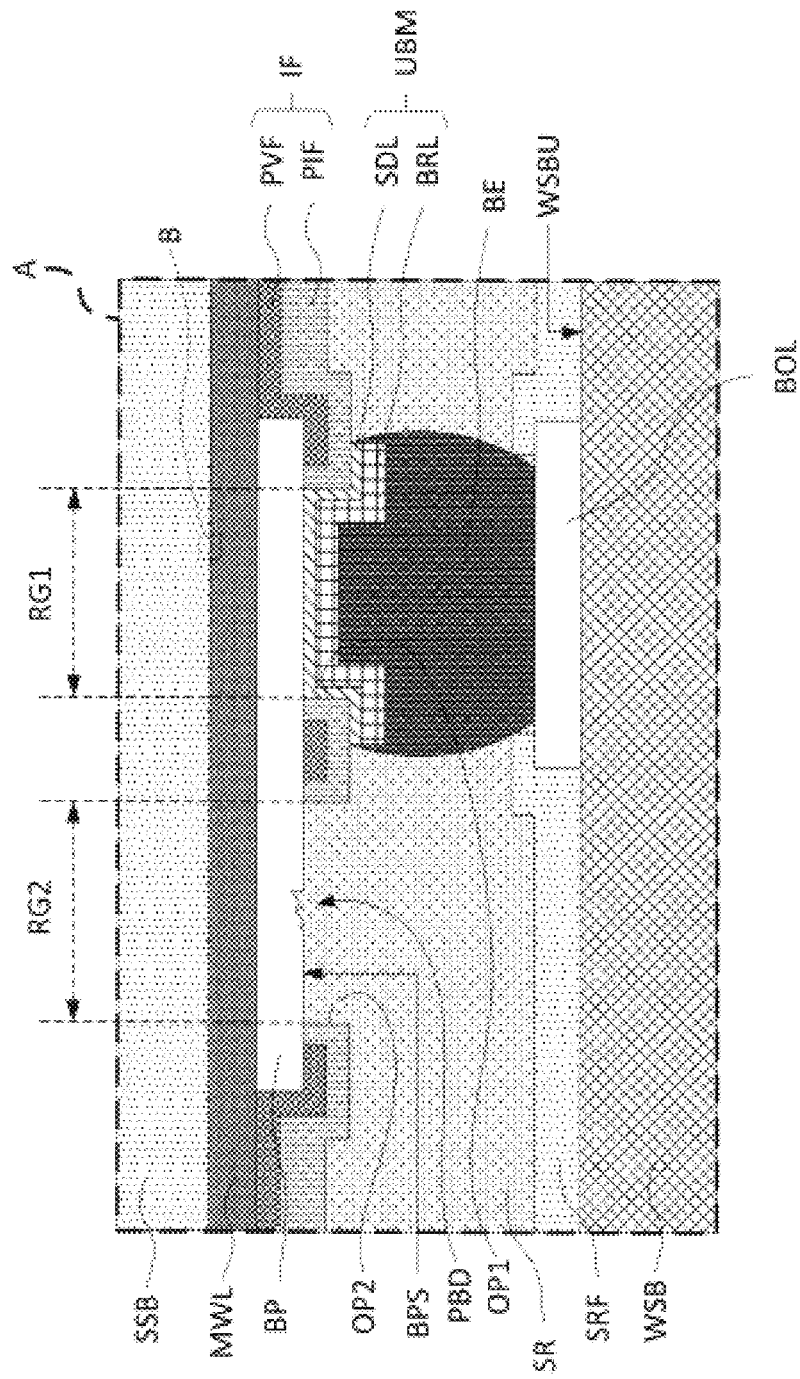
FIG. 2 is an enlarged cross-sectional view at "A" portion of FIG. 1.

First, a semiconductor device SMD according to the present embodiment will be described with reference to FIGS. 1 to 2. Incidentally, FIG. 1 is a cross-sectional view illustrating a configuration of the semiconductor device according to the present embodiment. Also, FIG. 2 is an enlarged cross-sectional view at "A" portion of FIG. 1.

As shown in FIG. 1, the semiconductor device SMD includes an interposer WSB and a semiconductor chip CP mounted on the interposer WSB. Here, the interposer WSB of the present embodiment is a wiring substrate having a plurality of wiring layers (not shown in all) and an insulating layer (not shown). Also, the planar shape of each of the semiconductor chip CP and the interposer WSB, although not shown, is comprised of a square.

Further, as shown in FIG. 1, the semiconductor chip CP is mounted on the upper surface WSBU of the interposer WSB via the bump electrode BE. Then, as shown in FIG. 1, between the semiconductor chip CP and the interposer WSB is sealed with a resin SR. The bump electrode BE of the present embodiment is comprised of, for example, tin (Sn). More specifically, the bump electrode BE is a solder bump of a so-called binary alloy comprised of tin (Sn) and silver (Ag). Further, the resin SR of the present embodiment is made of an epoxy resin having a plurality of fillers.

On the other hand, as shown in FIG. 1, a bump land BUL is formed on the lower surface WSBL of the interposer WSB that is opposed to upper surface WSBU. Then, on the bump land BUL, the external connection terminal EXT is formed. Incidentally, the external connecting terminal EXT of the present embodiment is comprised of, for example, tin (Sn). More specifically, the external connection terminal EXT is a solder ball of a so-called ternary alloy comprised of tin (Sn) silver (Ag) and copper (Cu). Further, the bump land BUL is made of a wiring pattern formed in the wiring layer located in the lowermost layer among the plurality of wiring layers described above. The bump land BUL of the present embodiment is comprised of, for example, copper (Cu).

Next, details at the junction of the semiconductor chip CP and the interposer WSB will be described with reference to FIGS. 2 to 3.

As shown in FIG. 2, upper surface WSBU of the interposer WSB, the bonding lead BOL to which the bump electrode BE is connected is formed. A solder resist film SRF is formed on upper surface WSBU of the interposer WSB so as to expose a part of the bonding lead BOL. Incidentally, the bonding lead BOL is comprised of a wiring pattern formed in the wiring layer located on the uppermost layer among the plurality of wiring layers described above. Also, the bonding lead BOL of the present embodiment is comprised of, for example, copper (Cu). In addition, the solder resist film SRF is made of an insulating member.

Further, as shown in FIG. 2, the semiconductor chip CP has a semiconductor substrate SSB, a bonding pad BP formed on semiconductor substrate SSB, and an insulating film IF formed on semiconductor substrate SSB. More specifically, on semiconductor substrate SSBs, as shown in FIG. 2, a plurality of wiring layers (not shown all), a plurality of wiring layers (not shown all), the multilayer wiring layer MWL is formed by laminating alternately. The bonding pad BP is formed of a wiring pattern formed on a wiring layer located at the uppermost layer among the plurality of wiring layers. That is, the bonding pad BP is one of the members composing the multilayer wiring layer MWL. The bonding pads BP of the present embodiment is comprised of, for example, aluminum (Al). Further, the semiconductor chip CP of the present embodiment has a plurality of bonding pads BP. Then, although not shown, the plurality of bonding pads BP is disposed along each side of the semiconductor chip CP (i.e., semiconductor substrate SSB).

Further, in the present embodiment, the non-volatile memory NVM is formed in semiconductor substrate SSB (for example, B portion in FIG. 2). Then, the bonding pad BP described above, via a plurality of wiring layers composing the multilayer wiring layer MWL, it is electrically connected to the non-volatile memory NVM. More specifically, although not shown, a plurality of non-volatile memories NVMs are formed in semiconductor substrate SSBs, and one memory circuit is formed by the plurality of non-volatile memories NVMs. The configuration of the present embodiment non-volatile memories will be described later with reference to FIG. 4.

Figure 3:
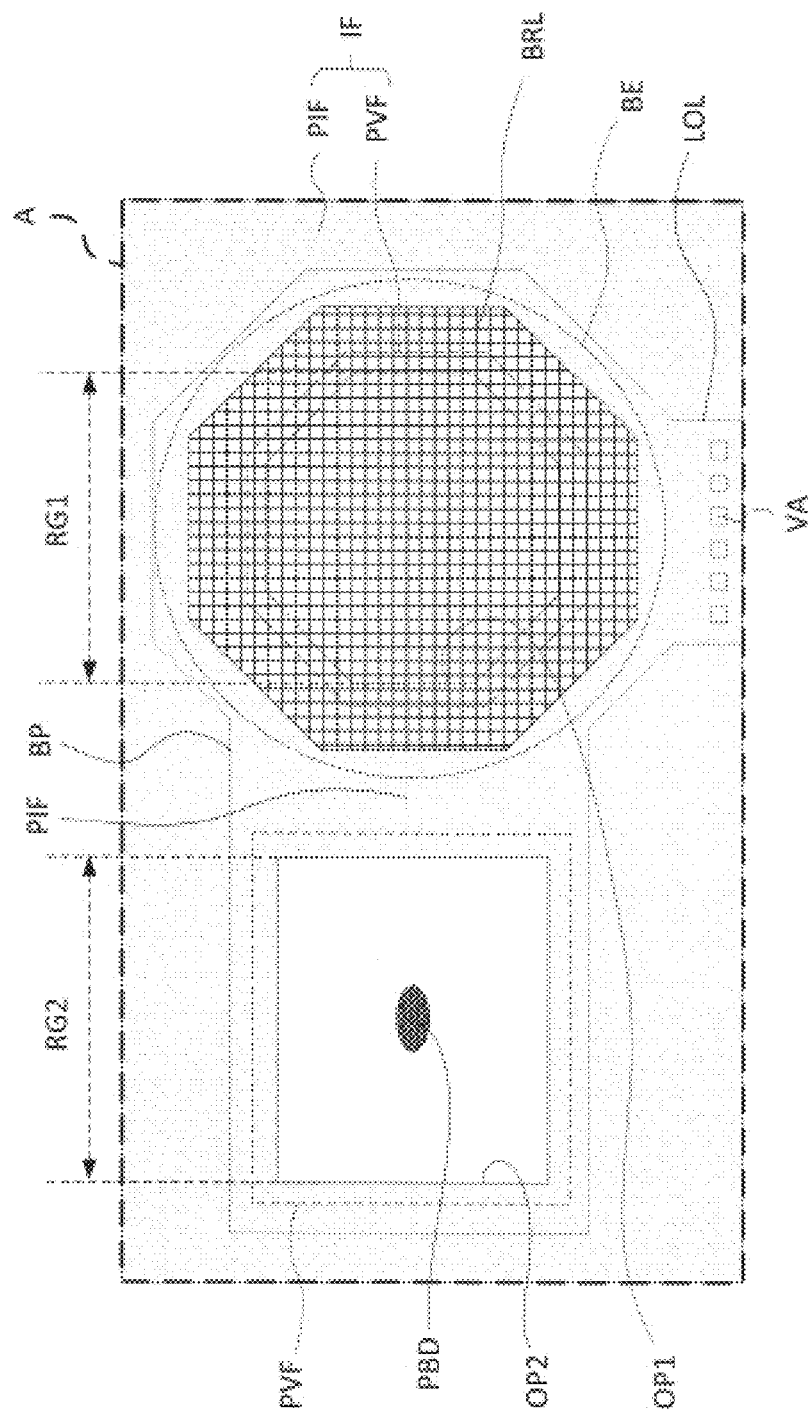
FIG. 3 is an enlarged plan view of a semiconductor chip at "A" portion of FIG. 1.

Further, the surface BPS of the bonding pad BP of the present embodiment, as shown in each of FIGS. 2 and 3, and a region RG1 exposed in the opening OP1 of the insulating film IF, the opening OP1 and a region RG2 exposed in the opening OP2 of the insulating film IF different from. Note that the region RG1 is a region in which the bump electrode BE described above is formed on a surface thereof (also referred to as a "bump electrode forming region") On the other hand, the region RG2 is a region (also referred to as a "probe region") in which the probe needles PBPs (see FIG. 5) used in the wafer testing process are contacted to the surface. Therefore, as shown in FIG. 2, a probe mark PBD formed by contacting the probe needle PBP is formed on the surface BPS of the bonding pad BP located in the region RG2.

As shown in FIG. 2, the insulating film IF of the present embodiment is formed on semiconductor substrate SSB, and includes a passivation film PVF made of an inorganic material, and a protective film PIF made of an organic material and formed on the passivation film PVF. As shown in FIGS. 2 and 3, the passivating film PVF and the protective film PIF are formed not only on the peripheral region of the front surface BPS of the bonding pad BP but also on the region located between the two regions RG1, RG2. In the present embodiment, as shown in FIGS. 2 and 3, the diameter (length of side) of each opening OP1, OP2 formed in the protective film PIF and exposing the surface BPS of the bonding pad BP is smaller (shorter) than the diameter (length of side) of each opening formed in the passivating film PVF and exposing the surface BPS of the bonding pad BP.

Furthermore, in the present embodiment, as shown in FIG. 2, the conductive film UBM is formed on the surface BPS of the bonding pad BP located in the area RG1. Then, as shown in FIG. 2, the bump electrode BE, through the conductive film UBM, is formed on the surface BPS of the bonding pad BP located in the area RG1. Incidentally, the conductive film UBM of the present embodiment is formed on the surface BPS of the bonding pad BP, and a seed layer SDL made of copper (Cu), is formed on the seed layer SDL, and a barrier layer BRL made of nickel (Ni). Further, although the detailed manufacturing process will be described later, each of the conductive film UBM and the bump electrode BE is formed using a plating method, a so-called plating layer (plating film).

Further, as described above, the bonding pad BP electrically connected to the non-volatile memory has an area RG1 whose surface BPS is covered with the conductive film UBM, and an area RG2 whose surface BPS is exposed without being covered with the conductive film UBM. Therefore, as shown in each of FIGS. 1 and 2, the resin SR for sealing between the semiconductor chip CP and the interposer WSB is in contact with the surface BPS of the bonding pad BP located in the area RG2 (i.e., probe mark PBD), but not in contact with the surface BPS of the bonding pad BP located in the area RG1.

<Details of Bonding Pad BP According to Present Embodiment>

Next, details of the bonding pad BP according to the present embodiment will be described with reference to FIGS. 2 and 3.

As shown in FIG. 3, the planar shape of the bump-electrode BE of the present embodiment is substantially circular. On the other hand, the planar shapes of the conductive film UBMs of the present embodiment are octagonal as shown in FIG. 3. Then, as shown in FIG. 2, the bump electrode BE is not only the surface of the conductive film UBM, also in contact with the side surface of the conductive film UBM. That is, as shown in FIG. 3, the diameter of the bump electrode BE is larger than the diameter of the conductive film UBM (interval of the two sides facing each other). As shown in FIG. 3, in the bonding pad BP, the bump electrode BE is formed above the bump electrode BE, i.e., a portion having the region RG1 and not having the region RG2, and the bonding pad BP has a substantially octagonal shape in plan view. Similarly, the planar shapes of the openings of the passivating film PVF and the protective film PIF exposing the surfaces BPS of the bonding pads BP located in the regions RG1 are octagonal.

Further, as shown in FIG. 3, the size of the probe mark PBD is smaller than the size of the bump electrode BE. For this reason, in the present embodiment, as shown in FIG. 3, the planar shape of the portion (the portion having the region RG2, but having no region RG1) of the bonding pad BP to where the probe needle PBP is to be contacted is substantially rectangular, the width of which is smaller than the diameter of the portion where the bump electrode BE is formed above the bonding pad BP. That is, as shown in FIG. 3, the number of corners of the planar shape of the portion having the region RG2 is less than the number of corners of the planar shape of the portion having the region RG1.

Furthermore, as shown in FIG. 3, the wiring layer bonding pad BP is formed, as shown in FIG. 3, the lead-out wiring LOL via wiring VA is connected also has. Then, the lead-out wire LOL, as shown in FIG. 3, is not connected to a portion (a portion having a region RG2, but having no region RG1) to where the probe needle PBP is to be contacted, but a portion (a portion having a region RG1, but having no region RG2) where the bump electrode BE is formed above. That is, the bump electrode BE includes a lead-out wiring LOL connected to the bonding pad BP, via the via wiring VA connected to the lead-out wiring LOL, it is electrically connected to the non-volatile memory.

As described above, the non-volatile memory NVM formed in semiconductor substrate SSB composing the semiconductor chip CP is electrically connected to the bonding lead BOL formed on upper surface WSBU of the interposer WSB via the bonding pad BP electrically connected to the non-volatile memory NVM and the bump electrode BE formed on the front surface BPS of the bonding pad BP located in the area RG1 via the conductive film UBM. Then, the bonding lead BOL, via the wiring layer composing the interposer WSB (not shown), and a bump land formed on the lower surface WSBL of the interposer WSB (bump land corresponding to the bonding lead BOL) BUL, are electrically connected. That is, the region RG1 of the bonding pad BP is also the main path of the signal transmission between the semiconductor chip CP and the external device is performed.

<Non-Volatile Memory NVM According to Present Embodiment>

Figure 4:
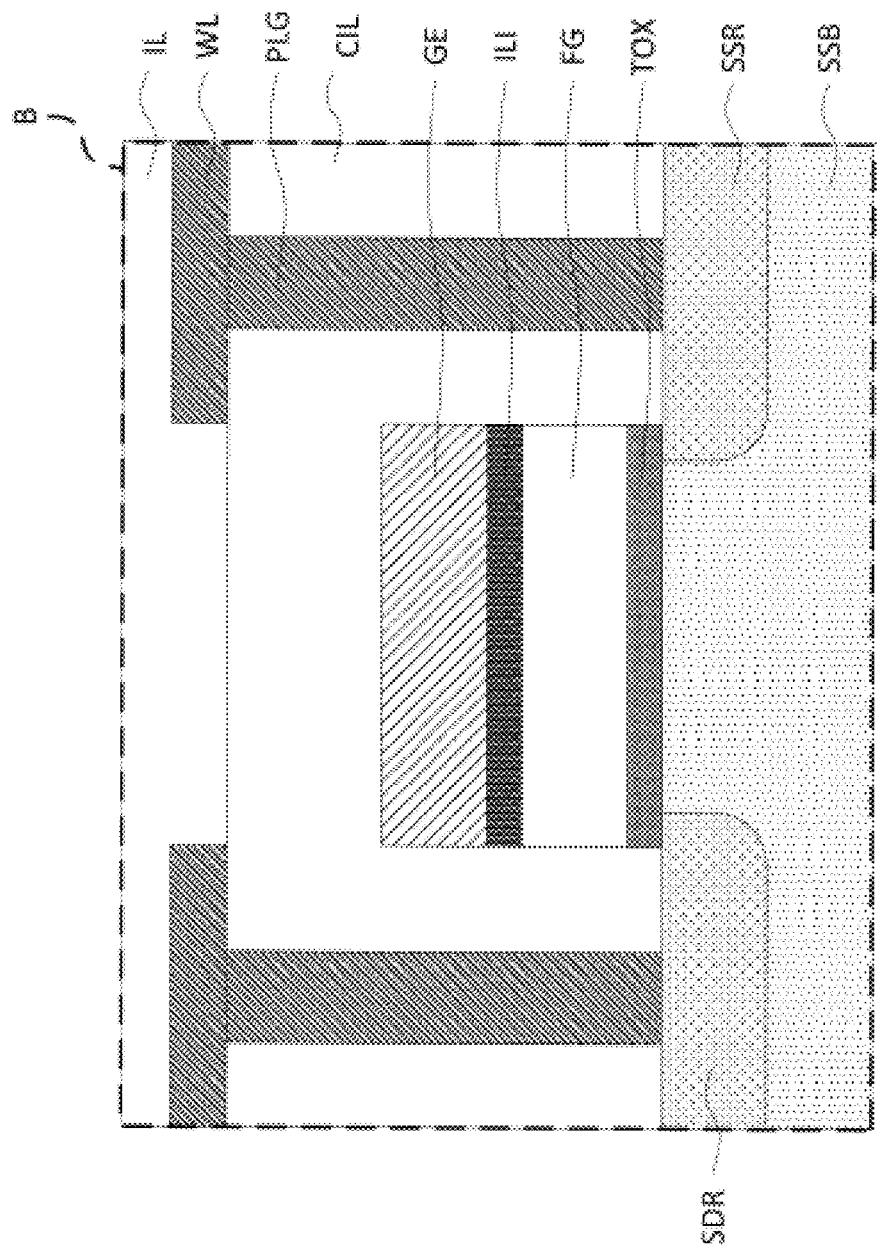
FIG. 4 is an enlarged cross-sectional view at "B" portion of FIG. 2.

Next, the non-volatile memory NVM according to the present embodiment will be described with reference to FIG. 4. FIG. 4 is an enlarged cross-sectional view at "B" portion of FIG. 2.

Firstly, the non-volatile memory NVM of the present embodiment is comprised of a field-effect transistor. More specifically, as shown in FIG. 4, the non-volatile memory NVM includes a semiconductor substrate SSB, a floating gate electrode FG formed on semiconductor substrate SSB through the tunnel oxide film TOX, a control gate electrode GE formed on the floating gate electrode FG through the interlayer insulating film ILI, among semiconductor substrate SSBs, a source region SSR formed in a portion located on one side of the floating gate electrode FG, and a drain region SDR formed in a portion located on the other side of the floating gate electrode FG among semiconductor substrate SSBs. The tunnel oxide film TOX is made of, for example, silicon oxide (SiO). The floating gate electrode FG is also made of, for example, polycrystalline silicon. Also, the interlayer dielectric ILI is made of silicon oxide (SiO), or, silicon oxide (SiO) and silicon nitride (SiN). Also, the control gate electrode GE is made of polycrystalline silicon, or, metal silicide. The thickness of the tunneling oxide film TOX of the present embodiment is, for example, 10 nm or less. Further, as shown in FIG. 4, the control gate electrode GE and the floating gate electrode FG is covered with a contact interlayer insulating layer CIL. Then, the wiring WL formed on the contact interlayer insulating layer CIL, via the contact plug PLG penetrating the contact interlayer insulating layer CIL, the source region SSR, or is electrically connected to the drain region SDR. Note that N-type or P-type impurities are ion-implanted into each of the source region SSR and the drain region SDR. Then, the contact interlayer insulating layer CIL, the contact plug PLG, the wiring WL, and, each of the interlayer insulating layer IL covering the wiring WL described above is one of the materials composing the multilayer wiring layer MWL described above.

In order to write data into the non-volatile memory NVM, hot electrons generated by accelerating electrons flowing from the source region SSR toward the drain region SDR in the vicinity of the drain region SDR are moved (injected) into the floating gate electrode FG functioning as the charge storage region through the tunnel oxide film TOX. On the other hand, in order to erase the data written to the non-volatile memory NVM, by applying a high electric field between the source region SSR and the floating gate electrode FG, electronics accumulated in the floating gate electrode FG, the floating gate electrode FG pulling out from the electrode FG.

<Effect of Semiconductor Device SMD According to Present Embodiment>

Next, the effect of the semiconductor device SMD according to the present embodiment will be described.

First, in the present embodiment, as shown in each of FIGS. 1 and 2, the semiconductor chip CP is electrically connected to the interposer WSB via the bump electrode BE. That is, a bump electrode BE is used as a means for electrically connecting the semiconductor chip CP with the interposer WSB. Therefore, it is possible to improve the transmission rate of the signal as compared with the configuration electrically connecting the semiconductor chip with the interposer via a bonding wire, such as, for example, Patent Document 3.

Further, in the present embodiment, as shown in FIG. 2, a bump electrode BE comprised of tin (Sn) is formed on the bonding pad BP comprised of aluminum (Al) via a conductive film UBM comprised of nickel (Ni). That is, the bump electrode BE comprised of tin (Sn) is not in direct contact with the bonding pad BP comprised of aluminum (Al). Therefore, the diffusion of tin (Sn) composing the bump electrode BE into the bonding pad BP can be suppressed.

In the present embodiment, as shown in FIG. 2, the probe mark PBD is formed on the surface BPS of the bonding pad BP located in the region RG2. That is, the probe mark PBD is not formed on the surface BPS of the bonding pad BP located in the region RG1. Therefore, the reduction of the junction reliability between the conductive film UBM and the bonding pad BP can be suppressed.

In the present embodiment, as shown in FIG. 2, the probe mark PBD is formed on the surface BPS of the bonding pad BP located in the region RG2. That is, the probe mark PBD is not formed on the surface of the conductive film UBM. Therefore, the reduction of the junction reliability between the bump electrode BE and the conductive film UBM can be suppressed.

In the present embodiment, as shown in FIG. 3, the planar shape of the portion (the portion having the region RG2, but having no region RG1) of the bonding pad BP to which the probe needle PBP is contacted is substantially a rectangular shape, the width of which is smaller than the diameter of the portion where the bump electrode BE is formed above the bonding pad BP. Therefore, the area occupied by each bonding pad BP can be reduced. That is, it is possible to realize the miniaturization or multi-pin of the semiconductor chip.

Furthermore, in the present embodiment, as shown in FIG. 3, the lead-out wire LOL is not connected to a portion (a portion having a region RG2, but having no region RG1) to where the probe needle PBP is to be contacted, but a portion (a portion having a region RG1, but having no region RG2) where the bump electrode BE is to be formed above. That is, on the main path where the signal is transmitted between the semiconductor chip CP and the external device, the probe mark PBD is not formed. Therefore, the high-speed semiconductor device can be realized.

<Method of Manufacturing Semiconductor Device SMD According to Present Embodiment>

Figure 5:
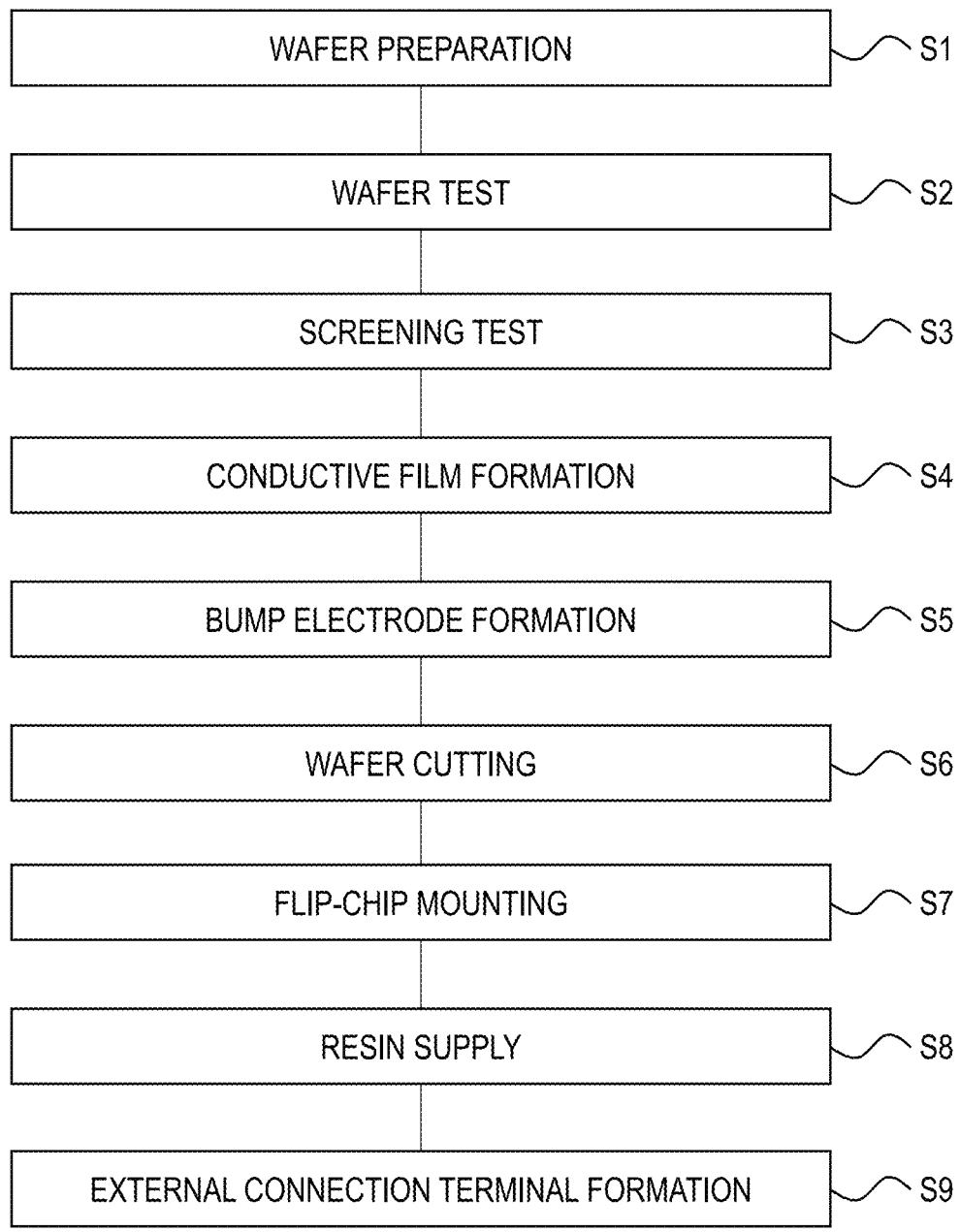
FIG. 5 is a process flow diagram showing a manufacturing process of the semiconductor device according to the present embodiment.

Next, a method of manufacturing the semiconductor device SMD according to the present embodiment will be described with reference to FIGS. 5 to 17. FIG. 5 is a process flow diagram showing a manufacturing process of the semiconductor device according to the present embodiment.

1. Wafer Preparation (Step S1 in FIG. 5)

Figure 6:
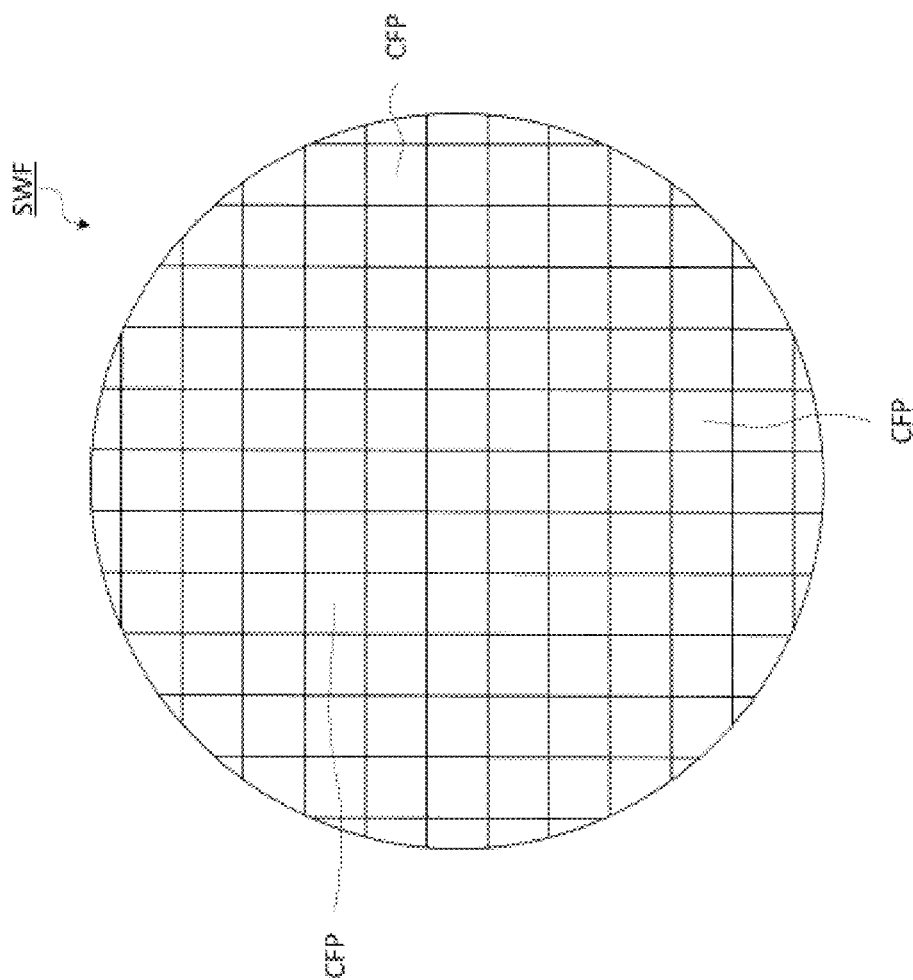
FIG. 6 is a plan view of a semiconductor wafer according to the present embodiment.

First, as step S1 in FIG. 5, a semiconductor wafer SWF is provided. The semiconductor wafer SWF has a plurality of chip forming portions CFP arranged in a matrix, as shown in FIG. 6. Incidentally, each chip forming unit CFP is acquired by performing the wafer cutting step to be described later (step S6 in FIG. 5), a portion to be a semiconductor chip CP.

Figure 7:
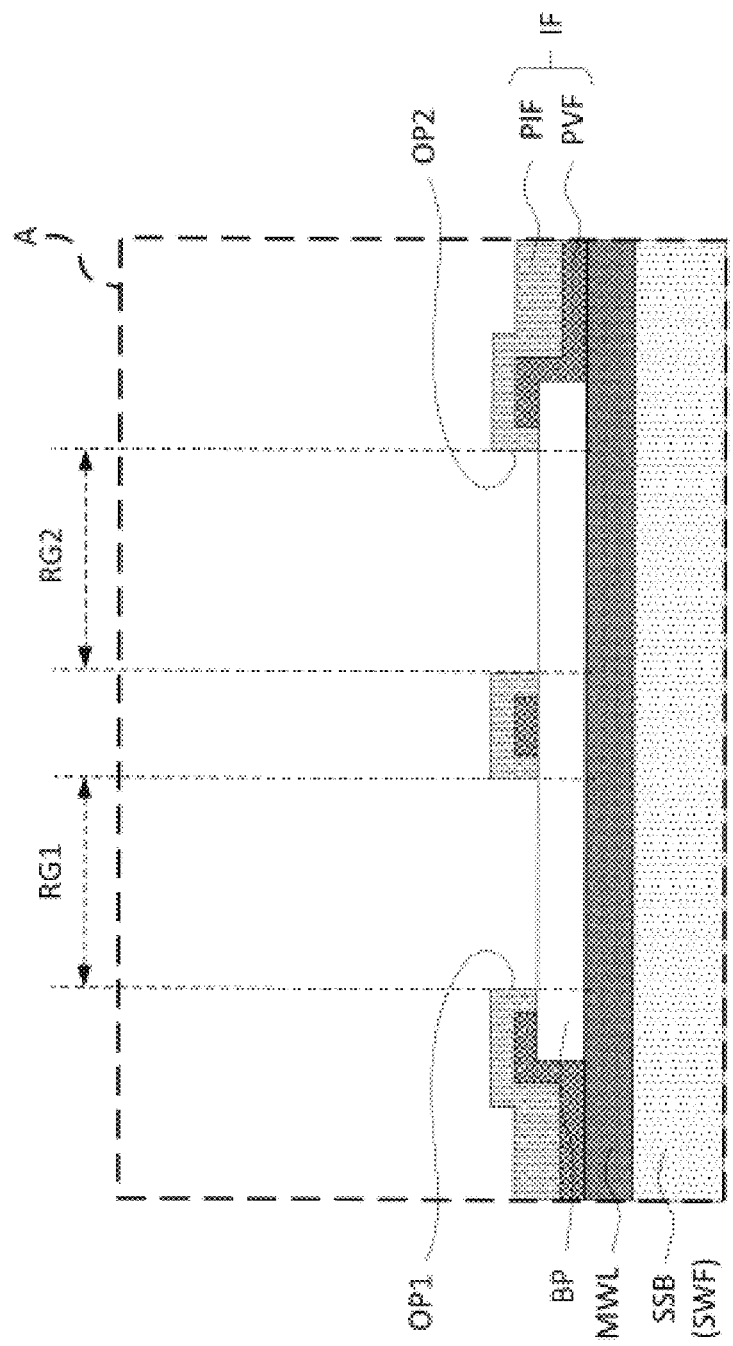
FIG. 7 is an enlarged cross-sectional view of the semiconductor chip at "A" portion of FIG. 1.

In the present embodiment, the respective manufacturing step of the semiconductor device SMD will be described using one of the plurality of chip-forming portions CFP described above. Furthermore, in the present embodiment, as shown in FIG. 7, on semiconductor substrate SSB composing the semiconductor wafer SWF, the above-described insulating film IF (in particular, the protective film PIF), and the respective openings OP1, OP2 from a state after forming, will be described. Incidentally, FIG. 7 is an enlarged cross-sectional view of the semiconductor chip at "A" portion of FIG. 1. The present embodiment protective film PIF is formed by disposing (supplying) an organic material on semiconductor substrate SSB and then performing heat treatment on the organic material. More specifically, the protective membrane PIFs of the present embodiment is made of a thermosetting polyimide resin which has fluidity prior to being cured. Further, the temperature of the heat treatment at the time of curing the organic material is, for example, 300° C. to 400° C. The time of the heat treatment per one time is, for example, 30 minutes to 2 hours.

2. Wafer Test (Step S2 in FIG. 5)

Figure 8:
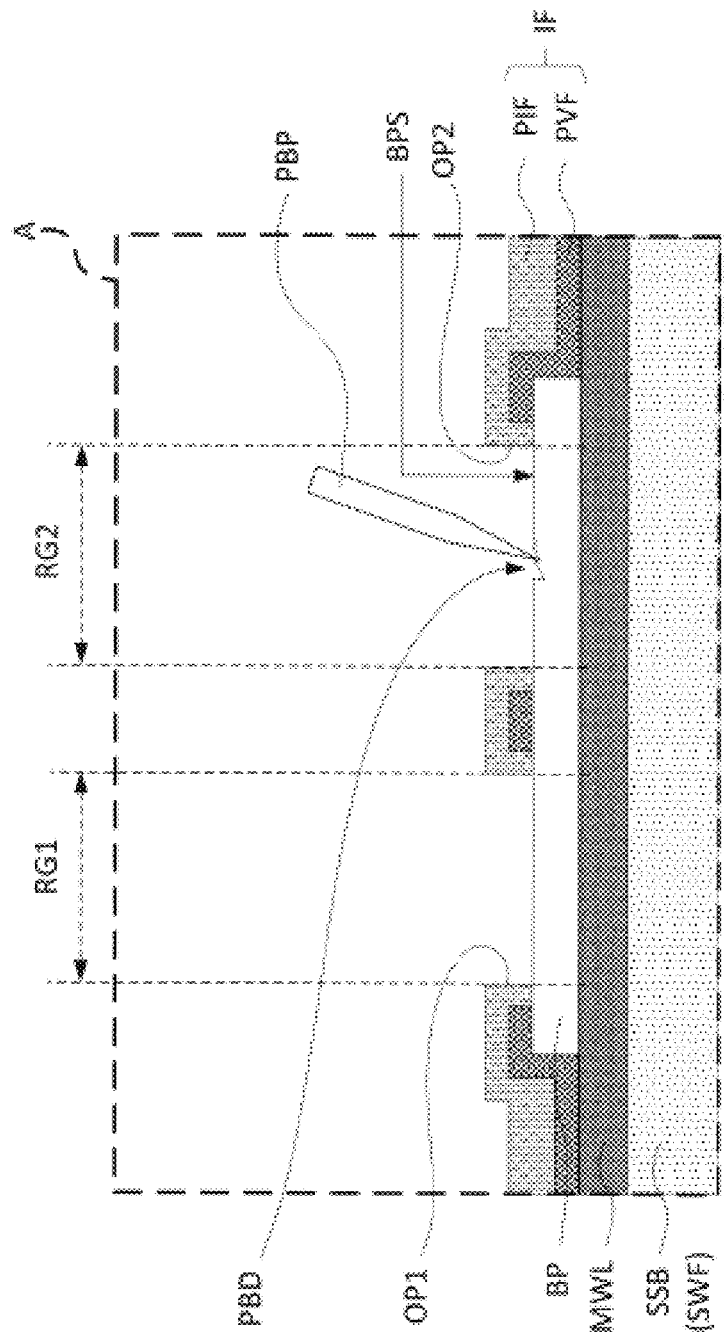
FIG. 8 is an enlarged cross-sectional view during the manufacturing process of the semiconductor device following FIG. 7.

Next, as step S2 in FIG. 5, the wafer test. In the wafer test of the present embodiment, the probe needle PBP is contacted with the surface BPS of the bonding pad BP located in the area RG2, as shown in FIG. 8, thereby writing the desired data to the non-volatile memory NVM formed in semiconductor substrate SSB. By performing this process, as shown in FIG. 8, the probe mark PBD formed by contacting the probe needle PBP is formed on the surface BPS of the bonding pad BP located in the region RG2.

3. Screening Test (Step S3 in FIG. 5)

Next, as step S3 of FIG. 5, a screening test (also referred to as "accelerated test"). In the present embodiment screening test, first, semiconductor substrate SSBs (i.e., semiconductor wafer SWFs) in which data is written to the non-volatile memory NVM in the wafer testing process described above are subjected to heat treatment. Note that the temperature of the heat treatment in the present screening test step is lower than the temperature of the heat treatment at the time of forming the aforementioned protective film PIF, and in the present embodiment, for example, 200° C. to 280° C. The time of the heat treatment per one time is longer than the time of the heat treatment at the time of forming the protective film PIF described above, and is, for example, 6 hours to 50 hours.

Thereafter, it is checked whether the data written in the non-volatile memory NVM can be read or the non-volatile memory NVM to which the data has been written in the wafer test process described above, that is, the memory circuit is accessed.

4. Conductive Film Formation (Step S4 in FIG. 5)

Next, as step S4 in FIG. 5, to form a portion which forms the basis of the conductive film UBM. A method of forming the conductive film UBM will be described with reference to FIGS. 9 to 11.

Figure 9:
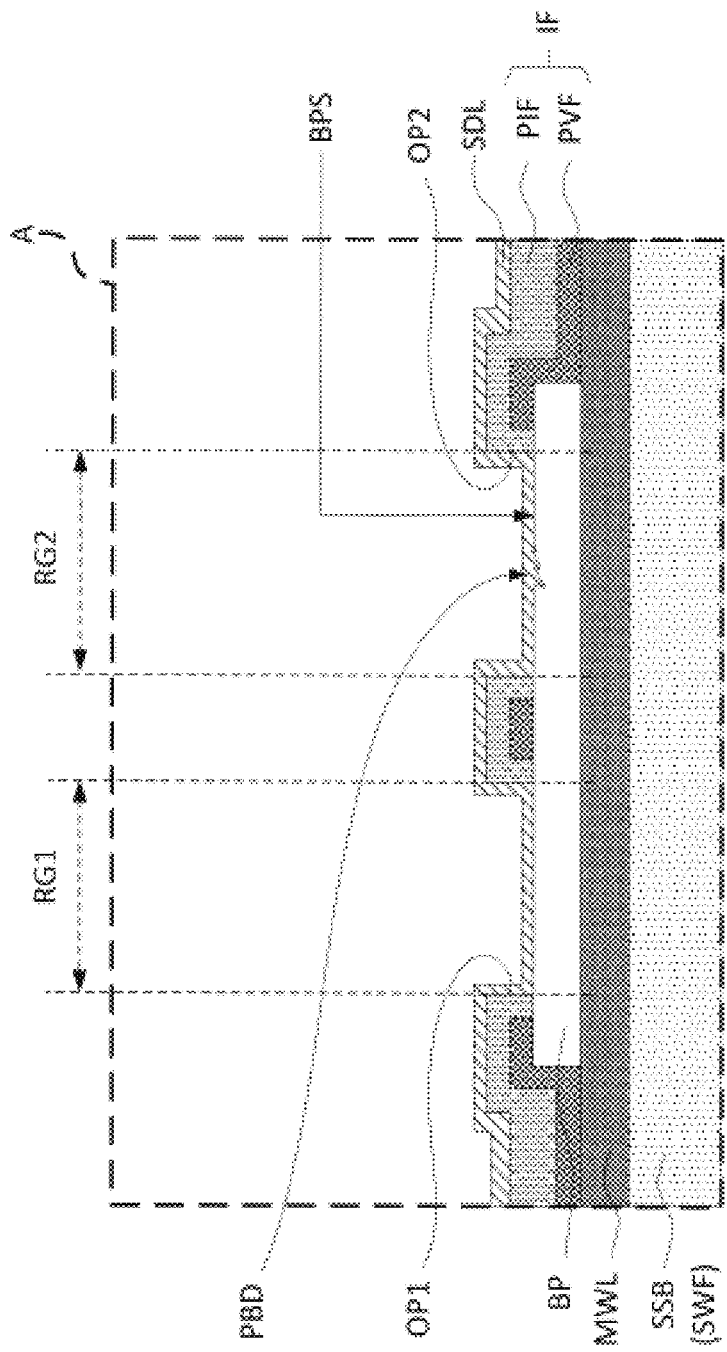
FIG. 9 is an enlarged cross-sectional view during the manufacturing process of the semiconductor device following FIG. 8.

First, as shown in FIG. 9, a seed-layer SDL made of, for example, copper (Cu) is formed on semiconductor substrate SSB (i.e., semiconductor wafer SWF). In the present embodiment, seed-layer SDLs are formed by, for example, a PVD (Physical Vapor Deposition) method. Thus, the seed layer SDL is formed not only on the surface BPS of the bonding pad BP located at each area RG1, RG2 but also on the insulating film IF as shown in FIG. 9. As shown in FIG. 9, the probe mark PBD is covered with the seed layer SDL.

Figure 10:
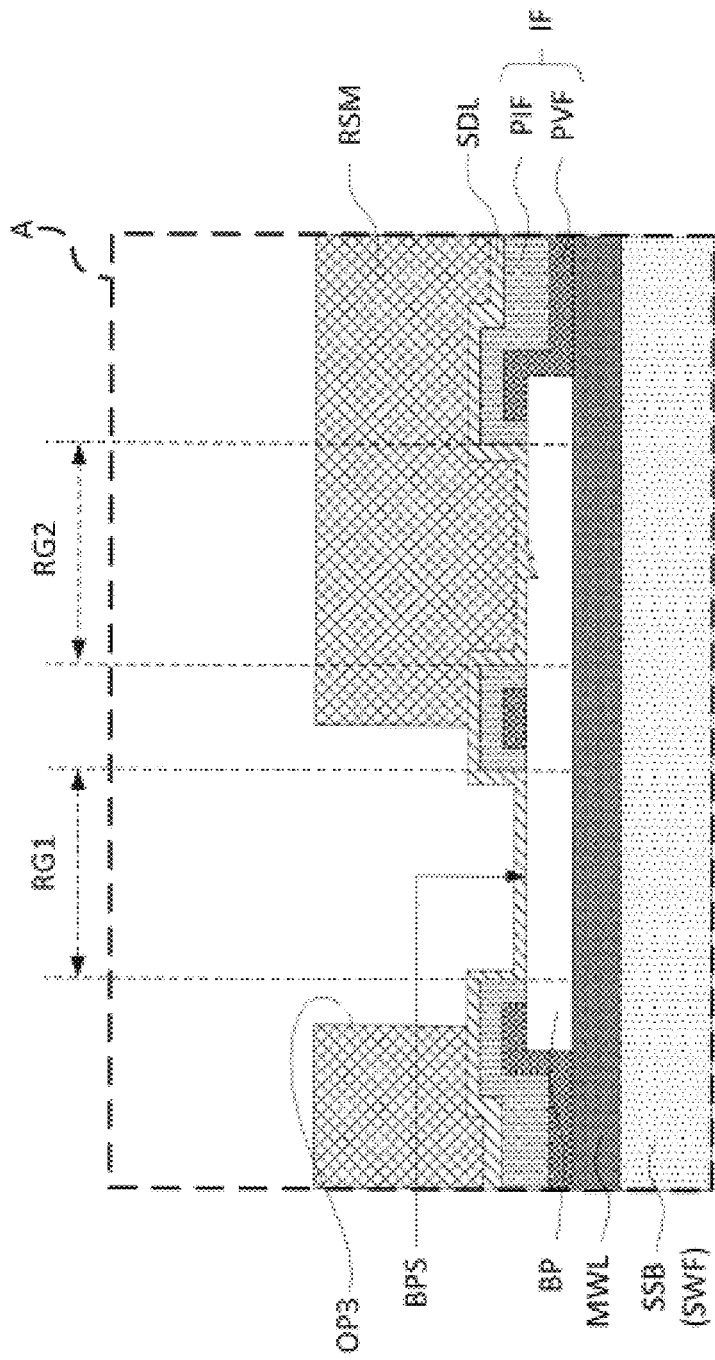
FIG. 10 is an enlarged cross-sectional view during the manufacturing process of the semiconductor device following FIG. 9.
Figure 11:
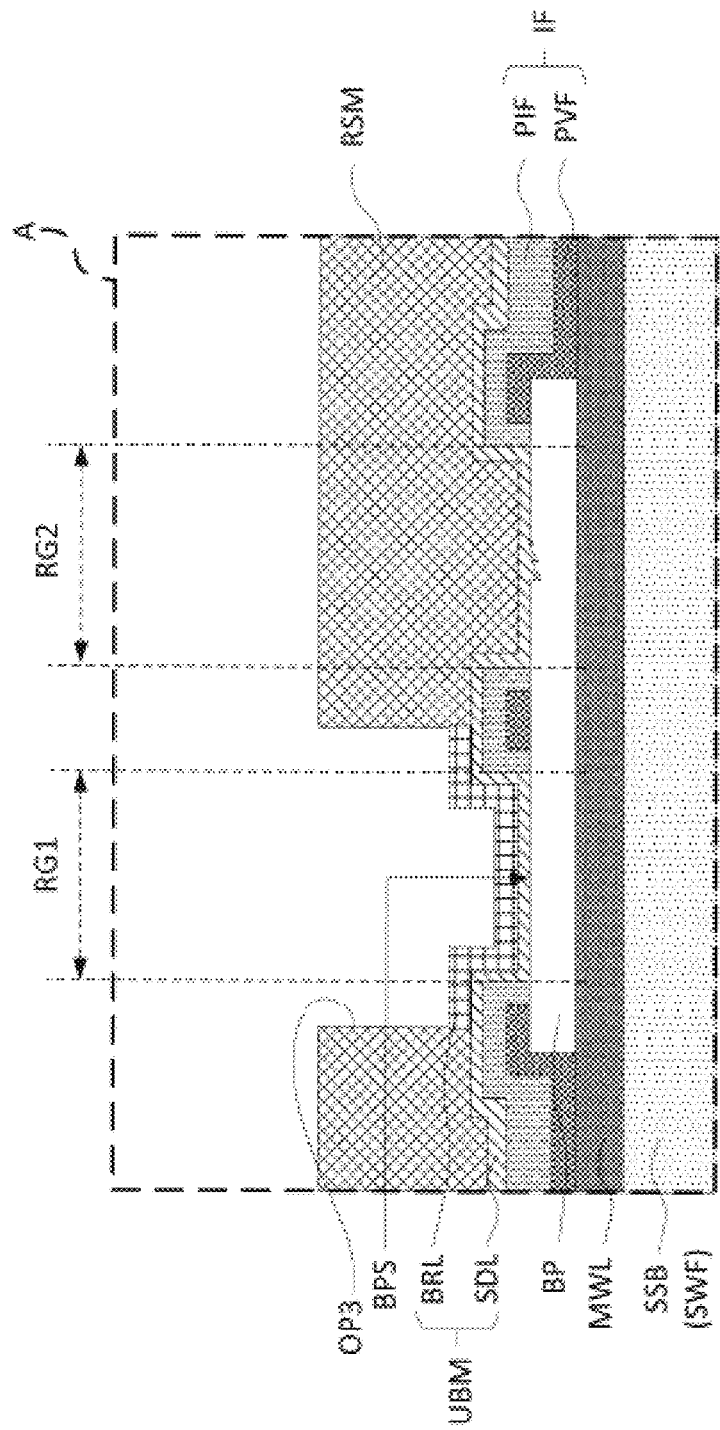
FIG. 11 is an enlarged cross-sectional view during the manufacturing process of the semiconductor device following FIG. 10.

Next, as shown in FIG. 10, a resist pattern RSM is formed on semiconductor substrate SSB. More specifically, first, a resist material is disposed on the insulating film IF so as to cover the regions RG1, RG2, and then the resist material is processed by, for example, lithography so as to expose the seed layer SDL formed on the front surface BPS of the bonding pad BP located on the region RG1. As a result, as shown in FIG. 10, the region RG2 is covered with the resist pattern RSM, and part of the seed layer SDL including the portion formed on the region RG1 is exposed from the opening OP3 of the resist pattern RSM. Next, as shown in FIG. 11, a barrier layer BRL made of nickel, for example, is formed on a portion of the seed layer SDL including a portion formed on the area RG1. In the present embodiment, for example, the barrier layer BRL is formed by electroplating using the resist pattern RSM as a mask. More specifically, as shown in FIG. 11, the step of forming the barrier layer BRL is performed in a state where the surface BPS of the bonding pad BP located in the area RG2 is covered with the resist pattern RSM, and in a state where the seed layer SDL formed on the surface BPS of the bonding pad BP located in the area RG1 is exposed from the resist pattern RSM.

Through the above-described process, a base part of the conductive film UBM composed of the seed layer SDL and the barrier layer BRL is formed on the front surface BPS of the bonding pad BP located in the area RG1.

5. Bump Electrode Formation (Step S5 in FIG. 5)

Next, as step S5 in FIG. 5, to form a bump electrode BE made of tin (Sn). Incidentally, in the present embodiment, similarly to the barrier layer BRL composing the conductive film UBM, using an electrolytic plating method to form a bump electrode BE. In the present embodiment, the resist pattern RSM used in the step of forming the conductive film UBM is continuously used as a mask in the present step.

Figure 12:
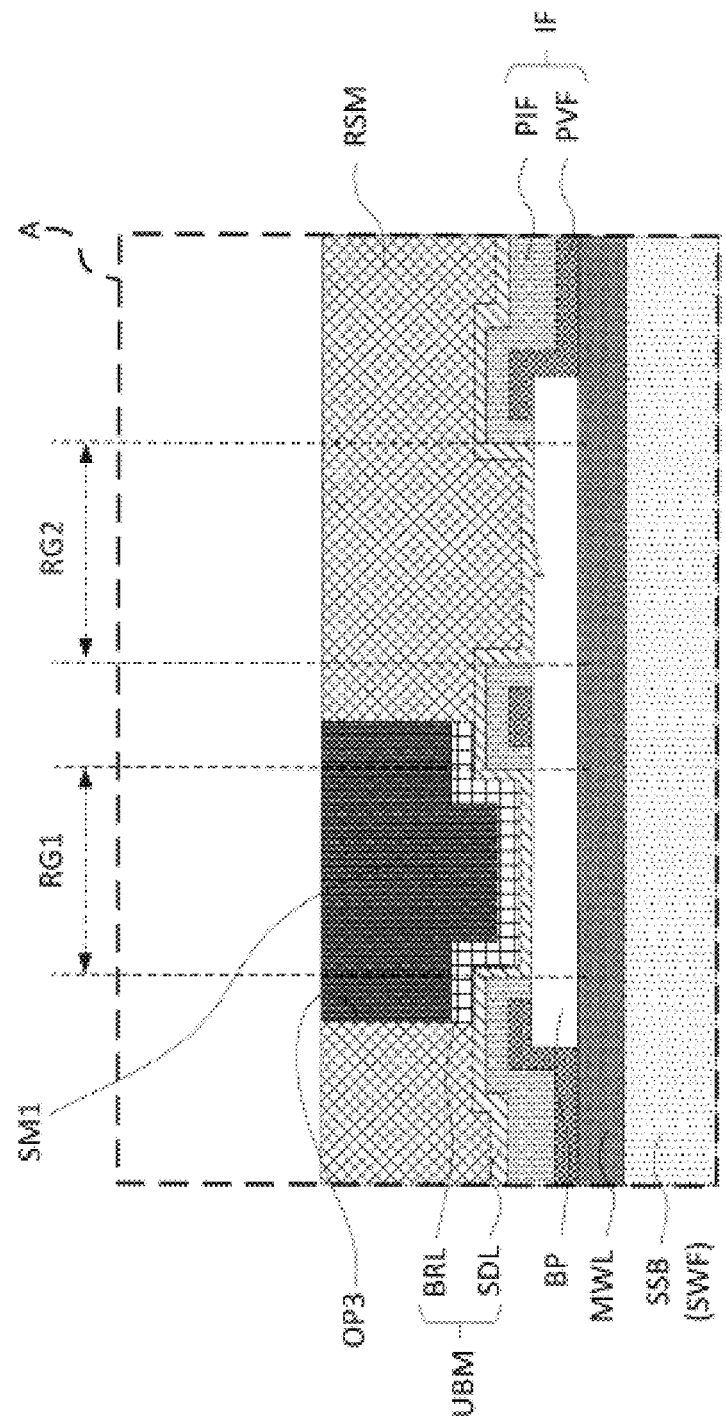
FIG. 12 is an enlarged cross-sectional view during the manufacturing process of the semiconductor device following FIG. 11.

More specifically, as shown in FIG. 12, the solder material SM1 of the so-called binary alloy comprised of tin (Sn) and silver (Ag) is supplied to the inside of the opening OP3 of the resist pattern RSM, thereby the opening OP3 of the resist pattern RSM is closed with the solder material.

Figure 13:
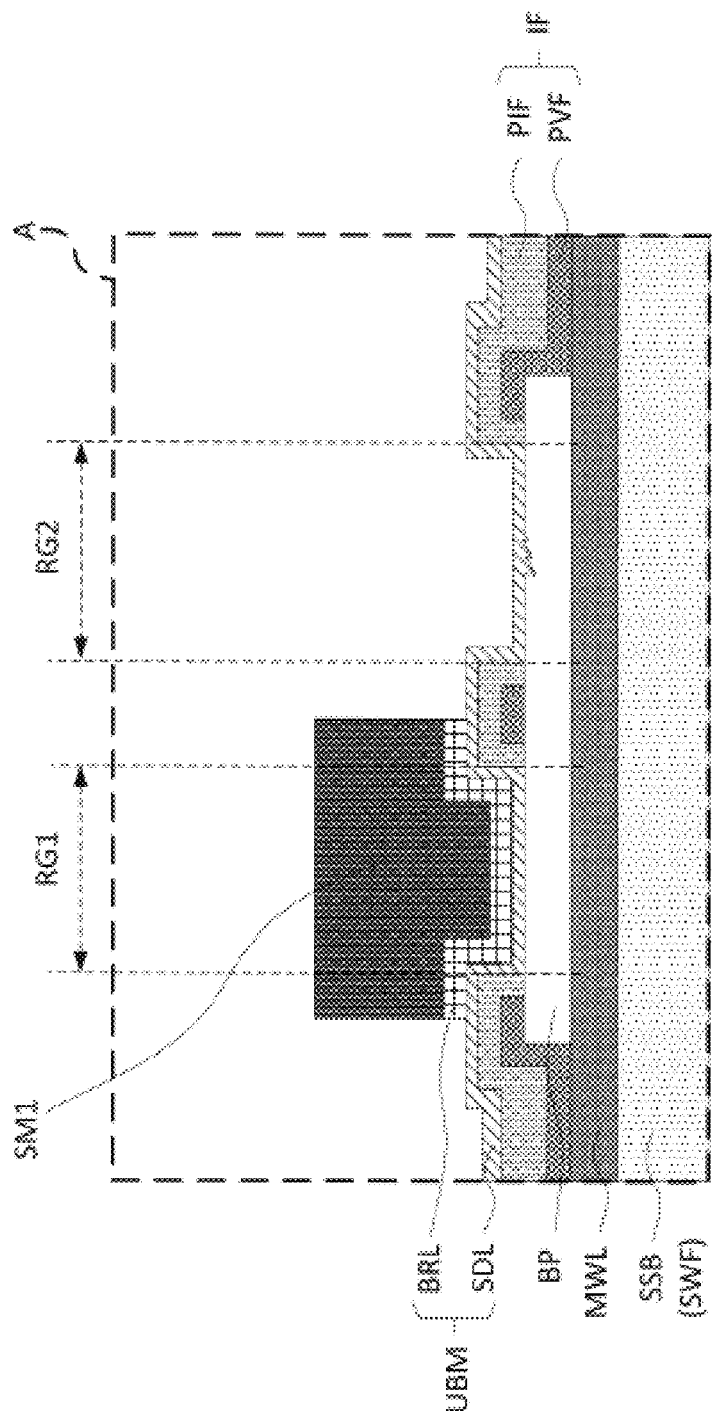
FIG. 13 is an enlarged cross-sectional view during the manufacturing process of the semiconductor device following FIG. 12.

Thereafter, as shown in FIG. 13, the resist pattern RSM is removed. As a result, as shown in FIG. 13, a portion of the seed layer SDL formed on the insulating film IF that is covered with the resist pattern RSM is exposed.

Figure 14:
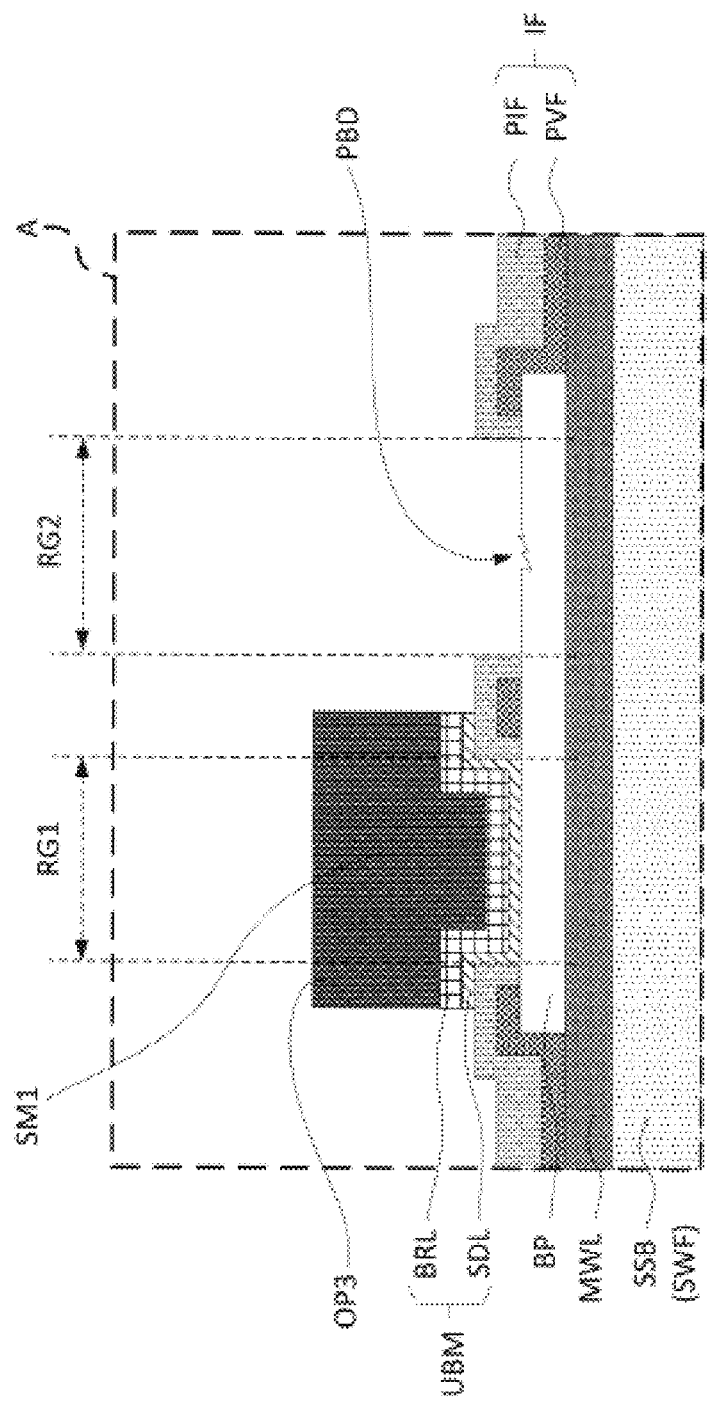
FIG. 14 is an enlarged cross-sectional view during the manufacturing process of the semiconductor device following FIG. 13.

Next, as shown in FIG. 14, portions of the seed layer SDL exposed from the solder material SM1 and the barrier layer BRL are removed from the seed layer SDL using the solder material SM1 and the barrier layer BRL as masks. In the present embodiment, unnecessary portions of the seed layer SDLs are removed by wet etching. As a result, a conductive film UBM composed of the seed layer SDL and the barrier layer BRL is formed.

Figure 15:
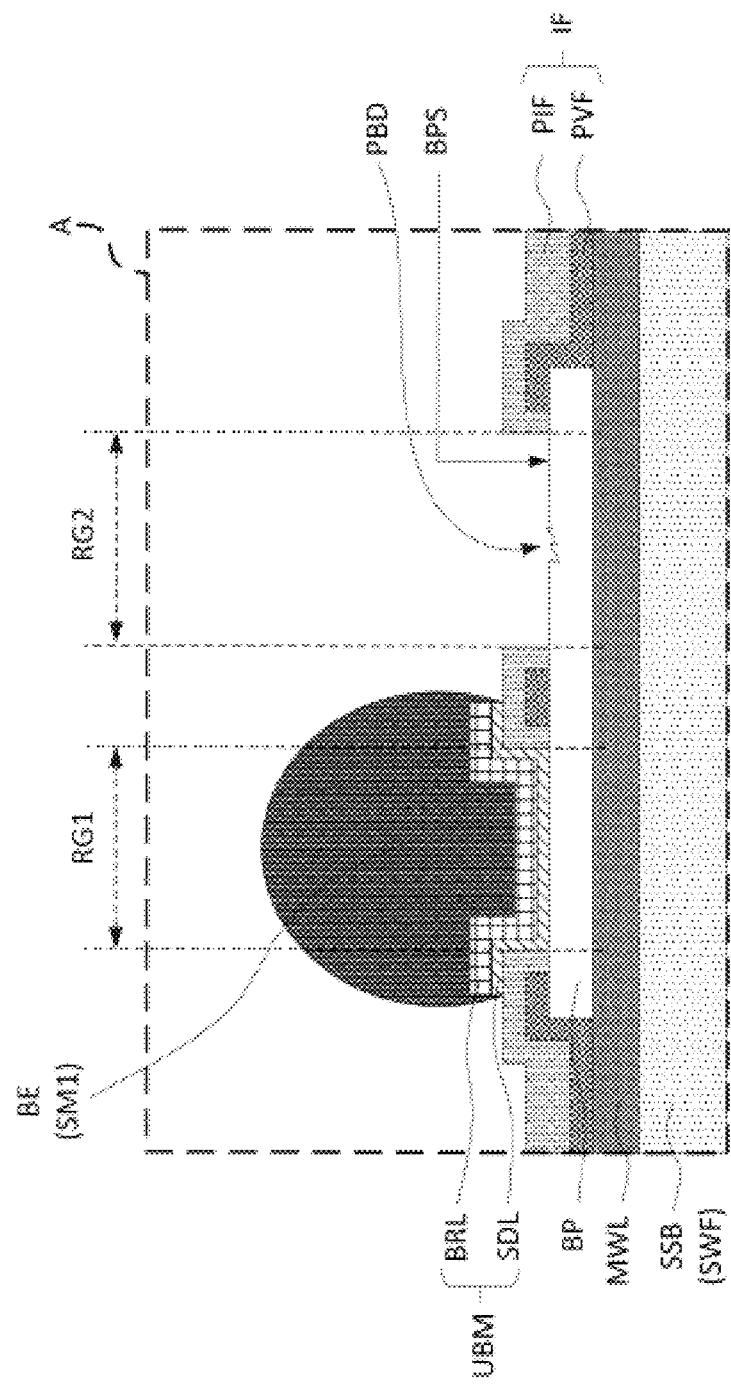
FIG. 15 is an enlarged cross-sectional view during the manufacturing process of the semiconductor device following FIG. 14.

After the unnecessary portions of the seed layer SDL are removed, the solder material SM1 formed in the step described above is subjected to heat treatment. Thus, as shown in FIG. 15, on the surface BPS of the bonding pad BP located in the area RG1, via the barrier layer BRL (i.e., conductive film UBM), to form a substantially spherical bump electrode BE. The temperature of the heat treatment in the bump-electrode forming step is lower than the temperature of the heat treatment in forming the protective film PIF described above, and in the present embodiment, the temperature is, for example, 100° C. to 270° C. In addition, the time of the heat treatment per one time is shorter than the time of the heat treatment in the aforementioned screening test step, for example, several tens of seconds to 5 minutes.

6. Wafer Cutting (Step S6 in FIG. 5)

Next, as step S6 of FIG. 5, by cutting the semiconductor wafer SWF, to separate the plurality of chip forming portion CFP from each other. More specifically, the plurality of chip forming portions CFP are separated from each other by passing a dicing blade (not shown) between the two chip forming portions CFP adjacent to each other among the plurality of chip forming portions CFP shown in FIG. 6. Thus, the bump electrode BE, the conductive film UBM, each chip forming portion CFP having a bonding pad BP and the non-volatile memory NVM, to obtain a semiconductor chip CP.

7. Flip-Chip Mounting (Step S7 in FIG. 5)

Figure 16:
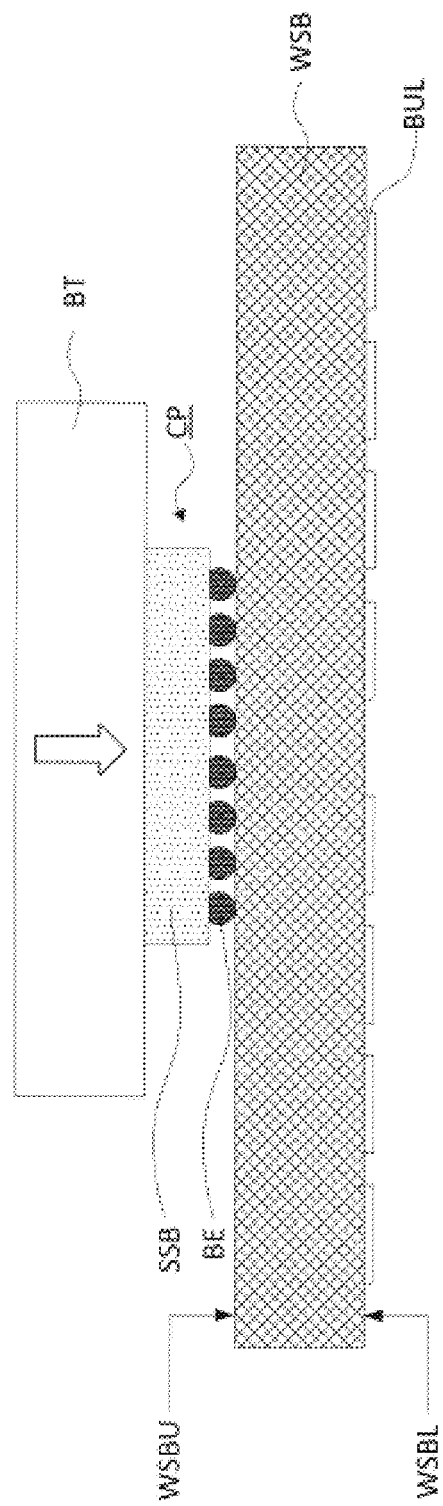
FIG. 16 is a cross-sectional view illustrating a flip-chip mounting process according to the present embodiment.

Next, as step S7 of FIG. 5, obtained by the aforementioned step, a semiconductor chip CP having a bump electrode BE, via the bump electrode BE, mounted on the interposer WSB. More specifically, as shown in FIG. 16, among semiconductor substrate SSBs composing the semiconductor chip CP, the surface located on the side where the bump electrode BE is formed (also referred to as "main surface") so as to face upper surface WSBU of the interposer WSB, the semiconductor chip CP on the interposer WSB. Then, while applying heat to each of the semiconductor chip CP and the interposer WSB (in particular, the bump electrode BE), as shown in FIG. 16, of semiconductor substrate SSB composing the semiconductor chip CP, the bump electrode BE is not formed with respect to the surface located on the side (also referred to as "back surface") to press the bonding tool BT. That is, as shown in FIG. 16, applying a vertical load (in the direction of the arrow) to the semiconductor chip CP. Thus, through the bump electrode BE which is melted by heat, the semiconductor chip CP (specifically, "bonding pad BP") is electrically connected to the interposer WSB (specifically, "bonding lead BOL"). The temperature of the heat treatment in the flip-chip mounting process is lower than the temperature of the heat treatment in forming the protective film PIF described above, and in the present embodiment, the temperature is, for example, 220° C. to 260° C. In addition, the time of the heat treatment per one time is shorter than the time of the heat treatment in the aforementioned screening test step, for example, several seconds to one minute.

8. Resin Supply (Step S8 in FIG. 5)

Figure 17:
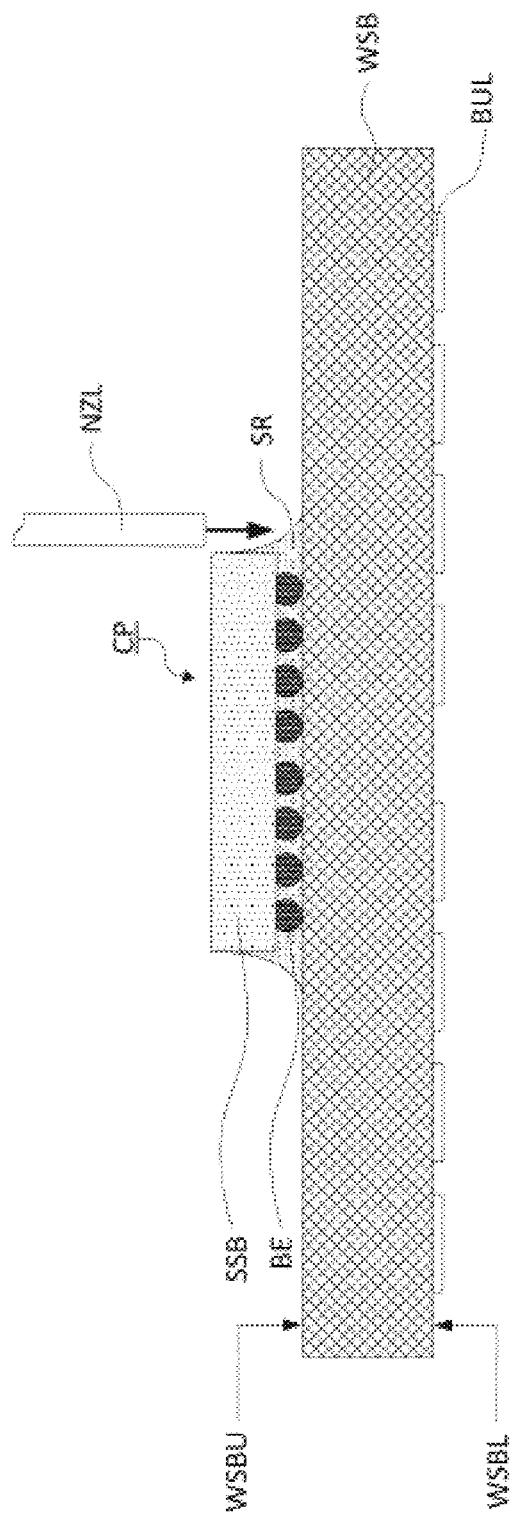
FIG. 17 is an enlarged cross-sectional view during the manufacturing process of the semiconductor device following FIG. 16.

Next, between the semiconductor chip CP and the interposer WSB, sealed with a resin SR. More specifically, as shown in FIG. 17, placing the nozzle NZL in the vicinity of the semiconductor chip CP, from the nozzle NZL, a resin SR having a plurality of fillers, between the semiconductor chip CP and the interposer WSB. Heat is applied to the resin SR supplied between the semiconductor chip CP and the interposer WSB to cure the resin SR. Note that the temperature of the heat treatment in the present resin supply step is lower than the temperature of the heat treatment at the time of forming the aforementioned protective film PIF, and in the present embodiment, for example, 100° C. to 200° C. In addition, the time of the heat treatment per one time is shorter than the time of the heat treatment in the aforementioned screening test step, for example, 10 seconds to 2 hours.

9. External Connection Terminal Formation (Step S9 in FIG. 5)

Thereafter, as step S9 in FIG. 5, the external connection terminal EXT comprised of tin (Sn) is formed (see FIG. 1). More specifically, the solder material of the so-called ternary alloy comprised of tin (Sn), silver (Ag) and copper (Cu) is disposed on the respective bump land BUL formed on the lower surface WSBL of the interposer WSB. Thereafter, the heat treatment is performed to the solder material. Thus, the substantially spherical external connection terminal EXT is formed on each bump land BUL. The temperature of the heat treatment in the external connecting terminal forming step is lower than the temperature of the heat treatment at the time of forming the protective film PIF described above, and in the present embodiment, the temperature is, for example, 100° C. to 270° C. In addition, the time of the heat treatment per one time is shorter than the time of the heat treatment in the aforementioned screening test step, for example, several tens of seconds to 5 minutes.

Through the steps described above, the semiconductor device SMD semiconductor chip CP is mounted on the interposer WSB through the bump electrode BE is manufactured. The completed semiconductor device SMD is mounted on the motherboard via the external connecting terminal EXT later. Incidentally, after forming the bonding pad BP on the semiconductor wafer SWF (i.e., semiconductor substrate SSB), among the temperatures of the heat treatment performed until mounting the semiconductor device SMD on the motherboard, the organic material composing the protective film PIF the temperature of the heat treatment performed is highest. Also, among the time of the heat treatment performed after forming the bonding pad BP on the semiconductor wafer SWF (i.e., semiconductor substrate SSB) until mounting the semiconductor device SMD on the motherboard, the time of the heat treatment in the screening test step is the longest.

<Effect of Method of Manufacturing Semiconductor Device SMD According to Present Embodiment>

Next, the effect of the manufacturing method of the semiconductor device SMD according to the present embodiment will be described.

First, in the present embodiment, as shown in FIG. 5, the wafer test (step S2 in FIG. 5) and the screening test (step S3 in FIG. 5) are performed after the wafer preparation step (step S1 in FIG. 5). That is, in the present embodiment, after the data is written in the non-volatile memory NVM, the heat treatment is performed to the semiconductor wafer SWF (i.e., semiconductor substrate SSB) on which the non-volatile memory NVM is formed, and then the step of checking the non-volatile memory NVM on which the data is written is performed after the heat treatment is performed to the organic material composing the insulating film IF (i.e., the protective film PIF). Here, as described above, the temperature of the heat treatment performed to the organic material composing the protective film PIF is as high as at least 300° C. or more. Also, the time of the heat treatment is at least several tens of minutes or more. Further, the data written in the non-volatile memory NVM is easily lost under the heat treatment condition of 300° C. or more and several tens of minutes or more. In particular, when the thickness of the tunnel oxide film TOX composing the non-volatile memory NVM is reduced, the data loss becomes remarkable. On the other hand, the data is hardly lost under the heat treatment condition of several seconds, even if the thickness of the tunnel oxide film is reduced, and even if the temperature of the heat treatment is less than 300° C., or, greater than or equal to 300° C. Then, in the present embodiment, as described above, the heat treatment for forming the protective film PIF is completed prior to writing the data into the non-volatile memory NVM. Thus, even if the thickness of the tunnel oxide film TOX composing the non-volatile memory NVM is reduced in order to realize the miniaturization of the semiconductor device (specifically, "thinning"), it is possible to avoid the data written to the non-volatile memory NVM disappearing due to the heat treatment condition (in particular, temperature) performed to the organic material.

In the present embodiment, the wafer test (step S2 in FIG. 5) and the screening test (step S3 in FIG. 5) are performed after the wafer preparing step (step S1 in FIG. 5) and prior to the bump-electrode forming step (step S5 in FIG. 5), as shown in FIG. 5. That is, in the present embodiment, after data is written in the non-volatile memory NVM, heat treatment is performed to the semiconductor wafer SWF (i.e., semiconductor substrate SSB) on which the non-volatile memory NVM is formed, and then the non-volatile memory NVM on which the data is written is checked, after the heat treatment is performed to the organic material composing the insulating film IF (i.e., the protective film PIF), and prior to forming the bump electrodes BE made of tin (Sn). As a result, even if the thickness of the tunnel oxide film TOX composing the non-volatile memory NVM is reduced, it is possible not only to avoid loss of data written in the non-volatile memory NVM, but also to suppress oxidation of the surface of the bump electrode BE made of tin (Sn) (i.e., deterioration of the junction reliability between the bump electrode BE and the bonding lead BOL of the interposer WSB).

In addition to the above, in the present embodiment, the wafer test (process S2 in FIG. 5) and the screening test (step S3 in FIG. 5) are performed after the wafer preparing step (step S1 in FIG. 5) and prior to the conductive film forming step (step S4 in FIG. 5), as shown in FIG. 5. After the conductive film forming process (step S4 in FIG. 5), a bump electrode forming step (step S5 in FIG. 5) is performed. In the present embodiment, the screening test step (step S3 in FIG. 5) is not performed after the conductive film forming step (step S4 in FIG. 5) and prior to the bump-electrode forming step (step S5 in FIG. 5). Therefore, it is possible to suppress oxidation of the surface of the conductive film UBM, in particular, the barrier layer BRL, by the heat treatment in the screening test step. In addition, as described above, since the bump electrode forming step (step S5 in FIG. 5) is performed after the conductive film forming step (step S4 in FIG. 5), it is possible to suppress the deterioration of the junction reliability between the bump electrode BE and the conductive film UBM. Furthermore, in the bump electrode forming step (step S5 in FIG. 5), the resist pattern RSM used in the conductive film forming step (step S4 in FIG. 5), since the continued use as a mask, simplification of the manufacturing process can also be realized.

Figure 19:
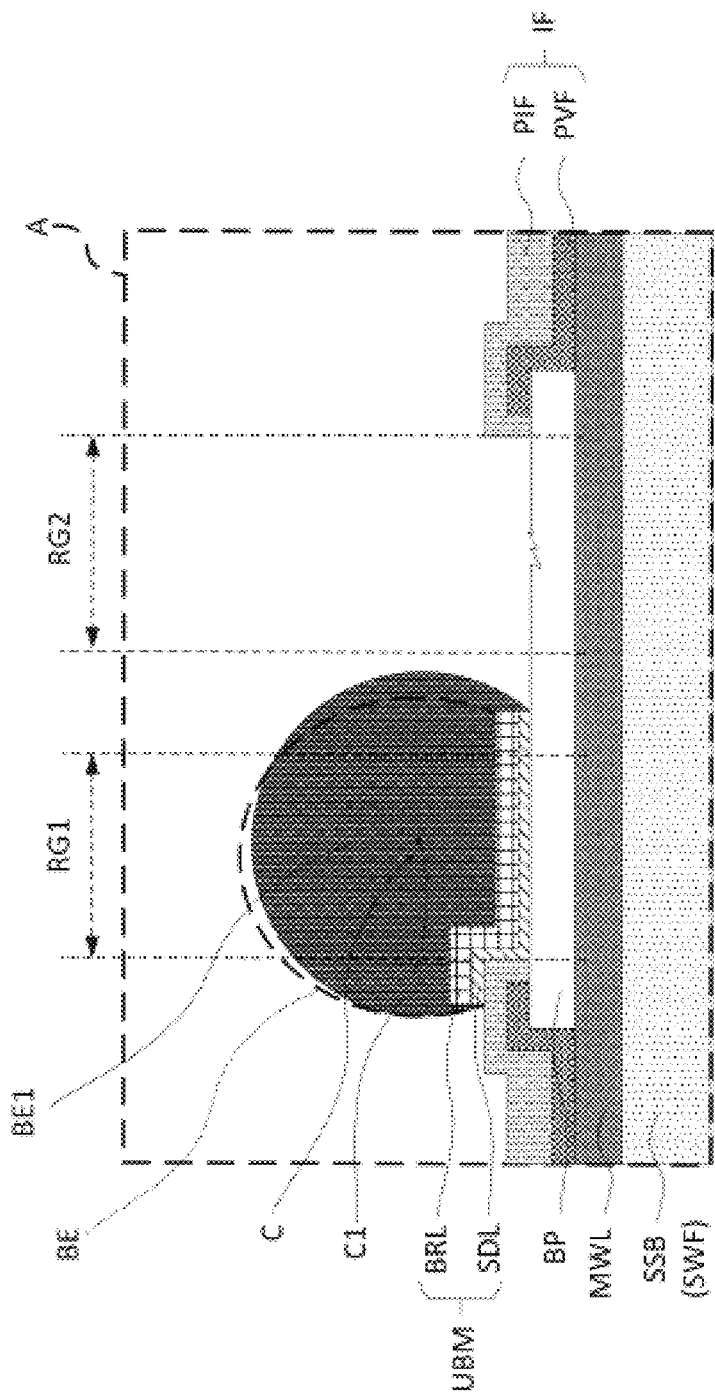
FIG. 19 is an enlarged cross-sectional view during a manufacturing process of a semiconductor device according to the examined example.

In the present embodiment, as shown in FIG. 2 and FIG. 15, the insulating film IF (specifically, the passivating film PVF and the protective film PIF) is formed not only on the peripheral region of the front surface BPS of the bonding pad BP but also on the region located between the two regions RG1, RG2. Here, if the insulating film IF on the region located between the two area RG1, RG2 is not formed, when subjected to heat treatment in the bump electrode forming term, as shown in FIG. 19, the center Cl of the bump electrode BE1 to be formed is shifted from the desired position (center C). That is, the height of the formed bump-electrode BE1 is reduced. Furthermore, in some cases, the solder material melted by the heat treatment may wet and spread onto the surfaces BPSs of the bonding pads BP located on the area RG2. Incidentally, the bump electrode is not formed in a desired shape (i.e., the height of the bump electrode is lowered), the gap between the semiconductor chip and the interposer is narrowed. As a result, it is difficult to supply the resin between the semiconductor chip and the interposer in the later resin supply step S8 in FIG. 5. On the other hand, in the present embodiment, as described above, the insulating film IF is also formed on the region located between the two regions RG1, RG2. Therefore, in the bump electrode forming step S5 of FIG. 5, the bump electrode BE can be formed in a desired shape.

Furthermore, in the present embodiment, as described above, not only to form an insulating film IF on the bonding pad BP, as shown in each of FIGS. 2 and 3, along the edge of the opening OP1 of the insulating film IF, the conductive film UBM on the insulating film IF. Therefore, when applying a normal load to the semiconductor chip CP in the subsequent flip-chip mounting step (step S7 in FIG. 5), of the multilayer wiring layer MWL, the stress transmitted to the region overlapping the bump electrode BE, it is possible to uniformize. Thus, as an insulating layer composing the multilayer wiring layer MWL, for example, even when using a low dielectric constant film such as a carbon-added silicon oxide film (SiOC), by the stress, that cracks are formed in the insulating layer, can be suppressed.

The invention made by the present inventor has been described above in detail based on the embodiment, but the present invention is not limited to the embodiment described above, and it is needless to say that various modifications can be made without departing from the gist thereof. As specific examples, modified example of the above embodiment will be described below.

Modified Example 1

First, in the above embodiment, when explaining the detailed at the junction of the semiconductor chip CP and the interposer WSB, it has been described based on the bonding pad BP electrically connected to the non-volatile memory. Further, the semiconductor chip of the above embodiment, as shown in FIG. 1, other bonding pads other than the bonding pad BP described above (i.e., electrically connected to the field effect transistor composing another circuit bonding pad) also has. The configuration of the other bonding pads is also the same as that of the bonding pad BP. However, for the bonding pads that do not require the wafer testing process (i.e., the process of contacting the probe needles PBPs) as described above, the probe area RG2 may not be provided as in the above embodiment. Thus, small of the semiconductor chip, or can be further realized multi-pin.

Modified Example 2

Also, in the above embodiment, it has been described that the planar shape of the portion (the portion having the region RG1, but having no region RG2) of the bonding pad BP on where the bump electrode BE is formed is substantially an octagonal shape as shown in FIG. 3. However, the planar shape of this portion is not limited to a polygon, it may be circular.

Modified Example 3

Also, in the above embodiment, the organic material composing the protective film PIF is subjected to the heat treatment at a timing after the organic material is disposed (supplied) on semiconductor substrate SSB, but the heat treatment may be performed (started) at a timing prior to the disposition of the organic material on semiconductor substrate SSB. However, if semiconductor substrate SSB is heated before the organic material is placed on semiconductor substrate SSB, the organic material may cure before the organic material placed on semiconductor substrate SSB becomes the desired configuration. Therefore, when a thermosetting polyimide resin having fluidity is used as a constituent material of the protective film PIF prior to curing, it is preferable that the organic material is placed (supplied) on semiconductor substrate SSB and then subjected to heat treatment as in the above embodiment.

Modified Example 4

Also, in the above embodiment has been described that each of the wafer test (step S2 in FIG. 5) and the screening test (step S3 in FIG. 5) is performed once, the wafer test, the screening test, or both the wafer test and the screening test may be performed a plurality of times.

Modified Example 5

Also, in the above embodiment, each of the barrier layer BRL and the solder material SM1, has been described for forming using an electrolytic plating method may be formed using an electroless plating method.

Modified Example 6

Also, in the above embodiment, as a method for removing the seed layer SDL, although the use of the wet etching method has been described, a dry etching method may be used.

Modified Example 7

Also, in the above embodiment, the configuration in which the semiconductor chip CP is mounted on the interposer WSB through the bump electrode BE, so-called, FCBGA (Flip Chip Ball Grid Array) was described as the semiconductor device SMD. However, the semiconductor chip CP bump electrode BE is formed (i.e., a state in which completed step S6 in FIG. 5) can also be viewed as one semiconductor device.

Modified Example 8

Also, in the above embodiment, as a method for sealing between the semiconductor chip CP and the interposer WSB with a resin SR, as shown in FIG. 17, the nozzle NZL in the vicinity of the semiconductor chip CP disposed, from the nozzle NZL, the semiconductor chip CP and interposer WSB supplying a resin SR between, it has been described a so-called underfill method. However, the interposer WSB in which the semiconductor chip CP is mounted on upper surface is set in the mold, to form a sealing body made of a resin SR on the interposer WSB so as to cover the semiconductor chip CP, it may be used a so-called transfer mold method.

Modified Example 9

Figure 18:
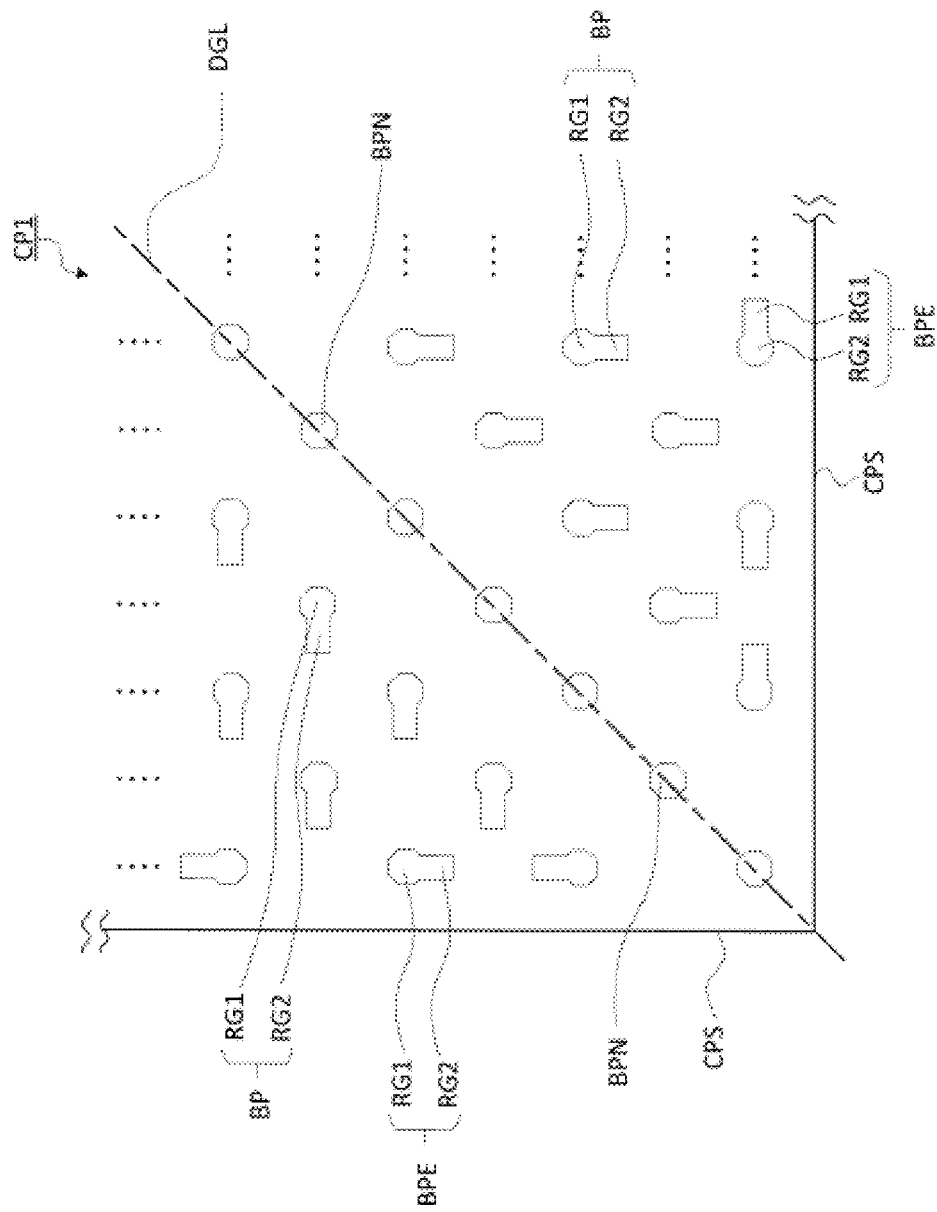
FIG. 18 is a partial enlarged plan view of a semiconductor device according to the modified example.

Also, in the above embodiment, a plurality of bonding pads BP has been described that are arranged along each side of the semiconductor chip CP (i.e., semiconductor substrate SSB). However, as shown in FIG. 18, a plurality of bonding pads BP, BPE, BPN, along each side CPS of the semiconductor chip CP1, and may be arranged in a matrix. Incidentally, the peripheral portion of the semiconductor chip, as compared with the central portion of the semiconductor chip, stress is likely to concentrate. Therefore, as shown in FIG. 18, it is preferable to arrange the bonding pads BP so that the region ("probe region") RG2 of each bonding pad BP is located closer to the side CPS of the corresponding semiconductor chip CP1 than the region ("bump-electrode forming region") RG1 of each bonding pad BP. Incidentally, a plurality of bonding pads BP arranged in a matrix, BPE, among BPN, for the bonding pad BPE located in the outermost peripheral row, as shown in FIG. 18, the respective regions RG1, RG2, along the side CPS of the semiconductor chip CP1 adjacent it may be arranged bonding pads BPE. Further, as shown in FIG. 18, it is preferable to arrange a bonding pad BPN having no region ("probing region") RG2 on the diagonal line DGL of the semiconductor chip CP1.

Modified Example 10

Also, in the above embodiment, it has been described that the bump electrode BE is a solder bump of a so-called binary alloy that is comprised of tin (Sn) and silver (Ag), and the external connection terminal EXT is a solder ball of a so-called ternary alloy that is comprised of tin (Sn), silver (Ag) and copper (Cu), respectively. However, as long as it is a material having tin (Sn) as its main component, a material other than a solder material made of each of the above-described compositions may be used. For example, the external connection terminal EXT may be a solder ball of a so-called binary alloy comprised of tin (Sn) and copper (Cu). Similarly, an alloy material obtained by adding copper (Cu), silicon (Si) or the like to aluminum (Al) may be used as the bonding pad, if the material has aluminum (Al) as a main component thereof.

Modified Example 11

Also, in the above embodiment, the external connection terminal EXT on the bump land BUL directly, it has been described to form. However, for example, the external connection terminal EXT may be formed on the bump land BUL through a plating film formed of a layer (nickel layer) made of nickel (Ni), a layer (palladium layer) formed on the nickel layer and made of palladium (Pd), and a layer (gold layer) formed on the palladium layer and made of gold (Au).

Modified Example 12

Further, to the extent not inconsistent with the gist described above for each modified example, a part or all of each modified example described above can be applied in combinations with each other.

What is claimed is:

1. A method of manufacturing a semiconductor device, the method comprising:
   step (a) providing a semiconductor wafer including:
      a semiconductor substrate;
      a non-volatile memory formed in the semiconductor substrate;
      a bonding pad formed on the semiconductor substrate, and electrically connected with the non-volatile memory, and comprised of aluminum; and
      an insulating film formed on the semiconductor substrate, and comprised of an organic material,
      wherein a surface of the bonding pad has:
         a first region exposed in a first opening portion of the insulating film; and
         a second region exposed in a second opening portion of the insulating film, which is different from the first opening portion, and
      wherein the insulating film is formed by performing a first heat treatment to the organic material;
   step (b) after the step (a), writing a data to the non-volatile memory by contacting a probe needle to the surface of the bonding pad located in the second region;
   step (c) after the step (b), performing a second heat treatment to the semiconductor wafer, and checking the non-volatile memory to which the data is written in the step (b),
   wherein a temperature of the second heat treatment is lower than a temperature of the first heat treatment, and
   wherein a time of the second heat treatment is longer than a time of the first heat treatment;
   step (d) after the step (c), forming a barrier layer comprised of nickel on the surface of the bonding pad located in the first region by using an electroplating method;
   step (e) after the step (d), forming a first solder material comprised of tin on the barrier layer by using the electroplating method; and
   step (f) after the step (e), forming a bump electrode on the surface of the bonding pad located in the first region via the barrier layer by performing a third heat treatment to the first solder material,
   wherein a temperature of the third heat treatment is lower than the temperature of the first heat treatment, and
   wherein a time of the third heat treatment is shorter than the time of the second heat treatment.

2. The method according to claim 1,
   wherein the non-volatile memory is comprised of:
      a floating gate electrode formed on the semiconductor substrate via a tunnel oxide film comprised of silicon oxide;
      a control gate electrode formed on the floating gate electrode via one of an interlayer insulating film made of silicon oxide and an interlayer insulating film made of silicon oxide and silicon nitride;
      a source region formed in a first portion of the semiconductor substrate, which is located on one side of the floating gate electrode; and
      a drain region formed in a second portion of the semiconductor substrate, which is located on another side of the floating gate electrode, and
   wherein a thickness of the tunnel oxide film is less than or equal to 10 nm.

3. The method according to claim 2 further comprising:
   step (g) after the step (c) and before the step (d), forming a seed layer on the semiconductor substrate by using PVD (Physical Vapor Deposition) method,
   wherein each of the step (d) and the step (e) is performed in a state that the surface of the bonding pad located in the second region is covered with a mask, and in a state that the surface of the bonding pad located in the first region is exposed from the mask, and
   wherein a portion of the seed layer, which is exposed from each of the first solder material and the barrier layer is removed after the step (e) and before the step (f).

4. The method according to claim 3 further comprising:
   step (h) after the step (f), obtaining a semiconductor chip having the bump electrode, the barrier layer, the bonding pad and the non-volatile memory by cutting the semiconductor wafer; and
   step (i) after the step (h), mounting the semiconductor chip obtained by the step (h) on an interposer via the bump electrode,
   wherein in the step (i), a vertical load is applied to the semiconductor chip.

5. The method according to claim 4 further comprising:
   step (j) after the step (i), sealing a gap between the semiconductor chip and the interposer with a resin having a plurality of fillers.

6. The method according to claim 5,
   wherein the interposer has:
      an upper surface on which the semiconductor chip is mounted;
      a lower surface opposite the upper surface; and
      a bump land formed on the lower surface,
   wherein the method according to claim 5 further comprising:
   step (k) after the step (j), forming a second solder material comprised of tin on the bump land; and
   step (l) after the step (k), forming an external connection terminal on the bump land by performing a fourth heat treatment to the second solder material,
   wherein a temperature of the fourth heat treatment is 100° C. to 270° C., and
   wherein a time of the fourth heat treatment is several tens of seconds to 5 minutes.

7. A method of manufacturing a semiconductor device, the method comprising:
   step (a) providing a semiconductor wafer including:
      a semiconductor substrate;
      a non-volatile memory formed in the semiconductor substrate;
      a bonding pad formed on the semiconductor substrate, and electrically connected with the non-volatile memory, and comprised of aluminum; and
      an insulating film formed on the semiconductor substrate, and comprised of an organic material,
      wherein a surface of the bonding pad has:
         a first region exposed in a first opening portion of the insulating film; and
         a second region exposed in a second opening portion of the insulating film, which is different from the first opening portion,
      wherein after arranging the organic material on the semiconductor substrate, the insulating film is formed by performing a first heat treatment to the organic material,
      wherein a temperature of the first heat treatment is 300° C. to 400° C., and
      wherein a time of the first heat treatment is 30 minutes to 2 hours;
   step (b) after the step (a), writing a data to the non-volatile memory by contacting a probe needle to the surface of the bonding pad located in the second region;

step (c) after the step (b), performing a second heat treatment to the semiconductor wafer, and checking the non-volatile memory to which the data is written in the step (b),
wherein a temperature of the second heat treatment is 200° C. to 280° C., and
wherein a time of the second heat treatment is 6 hours to 50 hours;
step (d) after the step (c), forming a conductive film comprised of nickel on the surface of the bonding pad located in the first region by using an electroplating method;
step (e) after the step (d), forming a first solder material comprised of tin on the conductive film by using the electroplating method;
step (f) after the step (e), forming a bump electrode on the surface of the bonding pad located in the first region via the conductive film by performing a third heat treatment to the first solder material,
wherein a temperature of the third heat treatment is 100° C. to 270° C., and
wherein a time of the third heat treatment is several tens of seconds to 5 minutes; and
step (g) after the step (f), obtaining a semiconductor chip having the bump electrode, the conductive film, the bonding pad and the non-volatile memory by cutting the semiconductor wafer.

8. The method according to claim 7,
wherein the non-volatile memory is comprised of:
  a floating gate electrode formed on the semiconductor substrate via a tunnel oxide film made of silicon oxide;
  a control gate electrode formed on the floating gate electrode via one of an interlayer insulating film made of silicon oxide and an interlayer insulating film made of silicon oxide and silicon nitride;
  a source region formed in a first portion of the semiconductor substrate, which is located on one side of the floating gate electrode; and
  a drain region formed in a second portion of the semiconductor substrate, which is located on another side of the floating gate electrode, and
wherein a thickness of the tunnel oxide film is less than or equal to 10 nm.

9. The method according to claim 7,
wherein the conductive film is comprised of:
a seed layer formed on the surface of the bonding pad, and comprised of copper; and
a barrier layer formed on the seed layer, and comprised of nickel,
wherein the step (d) includes:
step (d1) forming the seed layer on the semiconductor substrate by using PVD (Physical Vapor Deposition) method, and
step (d2) after the step (d1), forming the barrier layer on the seed layer by using an electroplating method,
wherein each of the step (d2) and the step (e) is performed in a state that the surface of the bonding pad located in the second region is covered with a mask, and in a state that the surface of the bonding pad located in the first region is exposed from the mask, and wherein a portion of the seed layer, which is exposed from each of the first solder material and the barrier layer is removed after the step (e) and before the step (f).

10. The method according to claim 9 further comprising:
step (h) after the step (g), mounting the semiconductor chip obtained by the step (g) on an interposer via the bump electrode,
wherein in the step (h), a vertical load is applied to the semiconductor chip.

11. The method according to claim 10 further comprising:
step (i) after the step (h), sealing a gap between the semiconductor chip and the interposer with a resin having a plurality of fillers.

12. The method according to claim 11,
wherein the interposer has:
  an upper surface on which the semiconductor chip is mounted;
  a lower surface opposite the upper surface; and
  a bump land formed on the lower surface,
wherein the method according to claim 11 further comprising:
  step (j) after the step (i), forming a second solder material comprised of tin on the bump land; and
  step (k) after the step (j), forming an external connection terminal on the bump land by performing a fourth heat treatment to the second solder material,
wherein a temperature of the fourth heat treatment is 100° C. to 270° C., and
wherein a time of the fourth heat treatment is several tens of seconds to 5 minutes.

13. The method according to claim 7, wherein the insulating film is comprised of:
a passivation film made of an inorganic material, and formed on the semiconductor substrate, and
a protective film made of the organic material, and formed on the passivation film.

14. The method according to claim 7,
wherein the semiconductor wafer includes a multi-layer wiring layer formed on the semiconductor substrate,
wherein a wiring layer located in an uppermost layer of the multi-layer wiring layer includes:
  the bonding pad; and
  a lead-out wiring connected to the bonding pad,
wherein the lead-out wiring is led out from the first region of the bonding pad, but not led out from the second region of the bonding pad, and
wherein the bump electrode is electrically connected with the non-volatile memory via the lead-out wiring connected to the bonding pad and via a via wiring connected to the lead-out wiring.

15. The method according to claim 7,
wherein the bonding pad has:
  a first portion having the first region, and on which the bump electrode is formed; and
  a second portion having the second region, and on which the bump electrode is not formed,
wherein a shape in plan view of the first portion is octagon, and
wherein a shape in plan view of the second portion is quadrangle having a width less than a diameter of the first portion.

* * * * *